(12) United States Patent
Tsutsui et al.

(10) Patent No.: US 9,347,491 B2
(45) Date of Patent: *May 24, 2016

(54) HARD FILM, HARD FILM FORMED BODY, AND ROLLING BEARING

(71) Applicant: NTN CORPORATION, Osaka-shi, Osaka (JP)

(72) Inventors: Hideyuki Tsutsui, Mie (JP); Kouya Oohira, Mie (JP); Masaki Nakanishi, Mie (JP)

(73) Assignee: NTN CORPORATION, Osaka (JP)

( * ) Notice: Subject to any disclaimer, the term of this patent is extended or adjusted under 35 U.S.C. 154(b) by 57 days.

This patent is subject to a terminal disclaimer.

(21) Appl. No.: 14/346,301

(22) PCT Filed: Sep. 21, 2012

(86) PCT No.: PCT/JP2012/074217
§ 371 (c)(1),
(2) Date: Mar. 20, 2014

(87) PCT Pub. No.: WO2013/042765
PCT Pub. Date: Mar. 28, 2013

(65) Prior Publication Data
US 2014/0219595 A1 Aug. 7, 2014

(30) Foreign Application Priority Data

Sep. 22, 2011 (JP) ................................. 2011-207936
Sep. 22, 2011 (JP) ................................. 2011-207983
Sep. 22, 2011 (JP) ................................. 2011-208005

(51) Int. Cl.
*F16C 33/58* (2006.01)
*F16C 33/62* (2006.01)
(Continued)

(52) U.S. Cl.
CPC ............... *F16C 33/62* (2013.01); *C23C 14/024* (2013.01); *C23C 14/027* (2013.01);
(Continued)

(58) Field of Classification Search
USPC .......... 384/492; 428/336, 408, 469, 472, 697, 428/698, 699
See application file for complete search history.

(56) References Cited

U.S. PATENT DOCUMENTS 6,357,923 B1 * 3/2002 Sato et al. ...................... 384/492
6,716,540 B2 * 4/2004 Kohara et al. ................. 428/408
(Continued)

FOREIGN PATENT DOCUMENTS

EP 1870609 A1 12/2007
EP 2362000 A1 8/2011
(Continued)

OTHER PUBLICATIONS

International Search Report PCT/JP2012/074217 dated Oct. 23, 2012.

*Primary Examiner* — Archene Turner
(74) *Attorney, Agent, or Firm* — Hedman & Costigan, P.C.; James V. Costigan; Kathleen A. Costigan

(57) ABSTRACT

The present invention provides a hard film which has high wear resistance and excellent peeling resistance and can be prevented from peeling off a base material over a long period of time and a hard film formed body on which the hard film is formed. A hard film (8) has a structure composed of a first mixed layer (8a), consisting mainly of Cr and WC, which is formed directly on a raceway surface (2a) of an inner ring (2) (base material) of a rolling bearing, a second mixed layer (8b), consisting mainly of WC and DLC, which is formed on the first mixed layer (8a), and a surface layer (8c), consisting mainly of DLC, which is formed on the second mixed layer (8b). In the first mixed layer (8a), a content rate of the Cr becomes continuously or stepwise lower and that of the DLC becomes continuously or stepwise higher from a side of the base material toward a side of the second mixed layer (8b). In the second mixed layer (8b), a content rate of the WC becomes continuously or stepwise lower and that of the DLC becomes continuously or stepwise higher from a side of the first mixed layer (8a) toward a side of the surface layer (8c). A content of hydrogen in the second mixed layer (8b) is set to 10 to 45 atomic percent.

22 Claims, 15 Drawing Sheets

(51) Int. Cl.

| | | |
|---|---|---|
| *C23C 14/02* | (2006.01) | |
| *C23C 14/06* | (2006.01) | |
| *F16C 33/64* | (2006.01) | |
| *F16C 33/32* | (2006.01) | |
| *F16C 33/34* | (2006.01) | |
| *F16C 33/56* | (2006.01) | |
| *F16C 33/66* | (2006.01) | |
| *C23C 14/34* | (2006.01) | |
| *C23C 28/00* | (2006.01) | |

(52) U.S. Cl.
CPC ........ *C23C 14/0605* (2013.01); *C23C 14/3464* (2013.01); *C23C 28/324* (2013.01); *C23C 28/341* (2013.01); *C23C 28/343* (2013.01); *C23C 28/347* (2013.01); *C23C 28/36* (2013.01); *F16C 33/32* (2013.01); *F16C 33/34* (2013.01); *F16C 33/565* (2013.01); *F16C 33/64* (2013.01); *F16C 33/6603* (2013.01); *F16C 2202/04* (2013.01); *F16C 2204/44* (2013.01); *F16C 2204/66* (2013.01); *F16C 2206/04* (2013.01); *F16C 2206/58* (2013.01); *F16C 2206/82* (2013.01); *F16C 2223/14* (2013.01); *F16C 2223/30* (2013.01); *Y10T 428/2495* (2015.01); *Y10T 428/30* (2015.01)

(56) References Cited

U.S. PATENT DOCUMENTS

| | | | | |
|---|---|---|---|---|
| 6,740,393 | B1 * | 5/2004 | Massler et al. | 428/216 |
| 6,994,474 | B2 * | 2/2006 | Kinno et al. | 384/492 |
| 7,498,083 | B2 * | 3/2009 | Yamamoto et al. | 428/698 |
| 8,518,542 | B2 * | 8/2013 | Hiraki et al. | 428/408 |
| 9,051,653 | B2 * | 6/2015 | Tsutsui et al. | 384/492 |
| 2007/0054125 | A1 | 3/2007 | Akari | |
| 2008/0304783 | A1 * | 12/2008 | Doll et al. | 384/565 |
| 2010/0086250 | A1 * | 4/2010 | Evans et al. | 384/571 |
| 2010/0247885 | A1 * | 9/2010 | Ito et al. | 428/216 |

FOREIGN PATENT DOCUMENTS

| | | | |
|---|---|---|---|
| JP | 2001-225412 | A | 8/2001 |
| JP | P3961739 | B | 10/2001 |
| JP | 2002-235748 | A | 8/2002 |
| JP | 2002-349577 | A | 12/2002 |
| JP | 2003-171758 | A | 6/2003 |
| JP | P4178826 | B | 11/2003 |
| JP | 2004-010923 | A | 1/2004 |
| JP | 2004-068092 | A | 3/2004 |
| JP | 2004-169137 | A | 6/2004 |
| JP | 2005-147244 | A | 6/2005 |
| JP | 2005-147306 | A | 6/2005 |
| JP | 2006-300294 | A | 11/2006 |
| JP | 2007-070667 | A | 3/2007 |
| JP | 2010-051641 | A | 3/2010 |
| JP | 2010-106311 | A | 5/2010 |
| JP | 2010-111935 | A | 5/2010 |
| JP | 2011-068941 | A | 4/2011 |
| WO | 2009/099226 | * | 8/2009 |
| WO | 2011/122662 | A1 | 6/2011 |

* cited by examiner (a)  (b)

(a) (b)

HARD FILM, HARD FILM FORMED BODY, AND ROLLING BEARING

TECHNICAL FIELD

The present invention relates to a hard film, excellent in its wear resistance and peeling resistance, which is formed on members such as sliding members, car parts, molding dies consisting of an iron-based base material and a superhard material and a hard film formed body on which the hard film is formed. More particularly the present invention relates to a rolling bearing in which the hard film is formed on a raceway surface of an inner ring, a raceway surface of an outer ring, a surface of a rolling element, and a sliding contact surface of a cage.

BACKGROUND ART

A hard carbon film is a hard film called diamond-like carbon (hereinafter referred to as DLC. Film/layer consisting mainly of DLC is also called DLC film/layer). Various naming is given to the hard carbon. For example, it is called a hard amorphous carbon, amorphous carbon, hard amorphous-type carbon, i-carbon, and diamond-shaped carbon. These terms are not clearly distinguished from one another.

As the essential quality of the DLC for which the above-described terms are used, the DLC has a structure in which diamond and graphite are mixed with each other and thus its structure is intermediate between that of the diamond and that of the graphite. The DLC has a high hardness almost equal to that of the diamond and is excellent in its wear resistance, solid lubricating property, thermal conductivity, chemical stability, and corrosion resistance. Therefore the DLC is utilized as protection films of dies, tools (dimension measuring jigs are included), wear-resistant mechanical parts, abrasive materials, sliding members, magnetic and optical parts. As methods of forming the DLC film, a physical vapor deposition (hereinafter referred to as PVD) method such as a sputtering method and an ion plating method; a chemical vapor deposition (hereinafter referred to as CVD) method; and an unbalanced magnetron sputtering (hereinafter referred to as UBMS) method are adopted.

The DLC film has the above-described excellent properties, whereas the DLC film generates a very large internal stress when the DLC film is formed. Although the DLC film has a high hardness and Young's modulus, it has a very small deformability. Thus the DLC film has disadvantages that it is low in its adhesiveness to a base material and liable to peel therefrom. As an art for improving the adhesiveness of the DLC film to the base material, an art of allowing the DLC film to display an excellent adhesiveness thereto even though the DLC film is formed comparatively thickly is proposed (see patent document 1). This art includes the outermost surface mainly composed of the DLC, the intermediate layer, and the base material. The base material consists of the iron-based material. The intermediate layer has the predetermined four-layer structure.

To improve the adhesiveness of the DLC film to the base material, there is proposed the art of forming the DLC film by using the graphite target and the hydrocarbon-based gas in combination as the carbon supply source and by carrying out the UBMS method under the predetermined conditions (see patent document 2).

As a concrete example of a sliding member, attempts are made to form the DLC film on raceway surfaces of bearing rings of a rolling bearing, rolling contact surfaces of rolling elements thereof, sliding contact surface of a cage thereof. Because the DLC film has the disadvantages that it is liable to peel off the base material, in forming the DLC film on the above-described surfaces of the bearing members of the rolling bearing, it is necessary to improve its adhesiveness to the surfaces of the bearing members.

To improve the adhesiveness of the DLC film to the base material by providing the hard film with the intermediate layer, there is proposed the rolling apparatus formed on the raceway groove or the rolling contact surfaces of the rolling elements made of an iron and steel material. The proposed rolling apparatus has the foundation layer which contains any one or more elements selected from among chromium (hereinafter referred to as Cr), tungsten (hereinafter referred to as W), titanium (hereinafter referred to as Ti), silicon (hereinafter referred to as Si), nickel, and iron as its composition; the intermediate layer, formed on the foundation layer, which contains the same constituent elements as those of the foundation layer and carbon such that the content rate of the carbon is larger at the side opposite to the foundation layer than at the side of the foundation layer; and the diamond-like carbon film, formed on the intermediate layer, which consists of argon and carbon such that the content rate of the argon is not less than 0.02 mass % nor more than 5 mass % (see patent document 3). To improve the adhesiveness of the DLC film to the base material by forming the intermediate layer, there is proposed the cage of the rolling bearing on which a plurality of films is formed such that the intermediate layer having the predetermined hardness is interposed between the film of the outermost layer and the cage (see patent document 4).

To improve the adhesiveness of the DLC film to the base material by an anchoring effect, there is proposed the rolling bearing in which irregularities whose height is 10 to 100 nm and average width is not more than 300 nm are formed on the raceway surface by means of ion bombardment process and the DLC film is formed on the raceway surface (see patent document 5).

In addition, there is proposed the cage composed of the hardened layer, subjected to the predetermined treatment, which is formed on the surface of the base material of the cage; the hard film, having a higher hardness than the hardened layer and coating the surface of the hardened layer therewith, which is formed on the surface of the hardened layer; and the soft film, having a solid lubrication effect and coating the surface of the hard film therewith, which is formed on the surface of the hard film. There is also proposed the method of producing this cage (see patent documents 6 and 7).

PRIOR ART DOCUMENT

Patent Document

Patent document 1: Japanese Patent Application Laid-Open Publication No. 2003-171758
Patent document 2: Japanese Patent Application Laid-Open Publication No. 2011-68941
Patent document 3: U.S. Pat. No. 4,178,826
Patent document 4: Japanese Patent Application Laid-Open Publication No. 2006-300294
Patent document 5: U.S. Pat. No. 3,961,739
Patent document 6: Japanese Patent Application Laid-Open Publication No. 2005-147306
Patent document 7: Japanese Patent Application Laid-Open Publication No. 2005-147244

SUMMARY OF THE INVENTION

Problems to be Solved by the Invention

But in the case where the art of the patent document 1 is used, the DLC film is inferior in its adhesiveness to the base material in dependence on a film structure and a film-forming condition. In addition, there is a fear that the DLC film is liable to peel off the base material due to a residual stress generated after the DLC film is formed. The DLC film which has peeled off the base material is incapable of displaying its excellent characteristics. To improve the peeling resistance of the hard film formed at a portion to which a high contact stress is applied over a long period of time, not only its static adhesiveness and mechanical property, but also its fatigue property is important. Although the adhesiveness of the DLC film to the base material is improved in the art of the patent document 2, further improvement of the DLC film structure and the like is desired to use it for a portion to be used in a severer condition.

The raceway surfaces of the inner and outer rings of the rolling bearing which guide the rolling elements are formed not as flat surfaces, but as curved surfaces in the configurations thereof. Some raceway surfaces have configurations in which main and sub-curvatures are combined with each other. The rolling contact surface of the rolling element has the configuration of a circumferential surface in the case where the rolling element is a cylindrical roller and a spherical surface in the case where the rolling element is a ball. The sliding contact surface of a cage is a surface (pocket surface of cage) which contacts the rolling elements and the bearing rings and has the configuration of a curved surface. When the DLC film is formed on the surfaces having the above-described configurations, there is a fear that in dependence on the structure thereof and a film-forming condition, the residual stress inside the DLC film becomes large and the DLC film peels off the surfaces having the above-described configurations immediately after the DLC film is formed thereon. Even though the DLC film does not peel off the surfaces immediately after it is formed thereon, there is a fear that the DLC film peels therefrom when it receives a rolling contact-caused load, an impact force, and a load such as a thermal impact generated by a local sliding contact when the bearing is in operation.

When the DLC film peels off the surfaces of the bearing members, metal contact occurs between bearing members. As a result, the bearing members wear. Thereby worn powders enter the rolling contact surface, which leads to damage of the raceway surface. In the case where grease lubrication is performed, the deterioration of grease could be accelerated owing to a catalytic action of a newly generated metallic surface.

The arts of the above-described patent documents 3 through 7 are intended to prevent the peeling of the DLC film off the surfaces of the bearing members. But to improve the practical use of the obtained rolling bearings, there is room for improvement of the film structures and the film-forming conditions in applying the DLC film to the rolling bearings. To improve the peeling resistance of the DLC film for a long term to the raceway surface to be subjected to a high contact stress and the sliding contact surface of the cage to be subjected to a strong impact force, as described above, the improvement of the film structures and the like are desired to be made by considering not only the static adhesiveness and mechanical property of the DLC film, but also its fatigue property.

The present invention has been made to deal with the above-described problems. Therefore it is an object of the present invention to provide a hard film which has high wear resistance and excellent peeling resistance and can be prevented from peeling off a base material over a long period of time; and a hard film formed body on which the hard film is formed. It is another object of the present invention to provide a rolling bearing which is excellent in its resistance to seizing, wear, and corrosion and can be prevented from being damaged owing to metal contact between bearing members by improving the peeling resistance of a DLC film formed on raceway surfaces of inner and outer rings of the rolling bearing and a sliding contact surface of a cage thereof and allowing the original characteristics of the DLC film to be displayed.

Means for Solving the Problems

A hard film of the present invention is formed on a surface of a base material having the hard film having a structure composed of a first mixed layer, consisting mainly of Cr and tungsten carbide (hereinafter referred to as WC), which is formed directly on a surface of the base material, a second mixed layer, consisting mainly of WC and DLC, which is formed on the first mixed layer, and a surface layer, consisting mainly of DLC, which is formed on the second mixed layer. In the first mixed layer, a content rate of the chromium becomes continuously or stepwise lower and that of the DLC becomes continuously or stepwise higher from a side of the base material toward a side of the second mixed layer. In the second mixed layer, a content rate of the WC becomes continuously or stepwise lower and that of the DLC becomes continuously or stepwise higher from a side of the first mixed layer toward a side of the surface layer. A content of hydrogen in the second mixed layer is set to 10 to 45 atomic percent.

A specific wear amount of the hard film is less than $200 \times 10^{-10}$ mm$^3$/(N·m) when a mating material consisting of a SUJ2 quenched steel having a surface roughness Ra of not more than 0.01 μm and Vickers hardness of HV 780 is rotated at a rotational speed of 0.05 m/s for 30 minutes with the hard film in contact with the mating material by applying a load of 0.5 GPa in a Hertzian maximum contact surface pressure to the hard film. In the hard film, a sum of an average value of indentation hardnesses and a standard deviation value is 25 to 45 GPa. In the hard film, a critical peeling load in a scratch test is not less than 50 N.

The surface layer consists of a film formed by using an unbalanced magnetron sputtering apparatus using argon gas as a sputtering gas. The surface layer is formed by using a graphite target and a hydrocarbon-based gas in combination as a carbon supply source and depositing carbon atoms generated by the carbon supply source on the second mixed layer in conditions in which a ratio of an amount of the hydrocarbon-based gas to be introduced into the apparatus is set to 1 to 5 to 100 which is an amount of the argon gas to be introduced thereinto, a vacuum degree inside the apparatus is set to 0.2 to 0.8 Pa, and a bias voltage to be applied to the base material is set to 70 to 150V. The hydrocarbon-based gas is methane gas.

The bias voltage is applied to the base material in such a way that the bias voltage is minus relative to the earth potential. For example, bias voltage of 150V means that the bias potential of the base material is −150V relative to the earth potential.

The surface layer has a relaxing layer at a side adjacent to the second mixed layer. The relaxing layer is formed by continuously or stepwise changing at least one of a rate of an introduction amount of the hydrocarbon-based gas, a vacuum degree inside the apparatus, and a bias voltage to be applied to the base material.

A thickness of the hard film is 0.5 to 3 µm. A ratio of a thickness of the surface layer to that of the hard film is not more than 0.7.

A hard film formed body of the present invention is composed of a base material and a hard film formed on a surface of the base material. The above-described hard film consists of the hard film of the present invention. The base material consists of a cemented carbide material or an iron-based material.

A rolling bearing of the present invention is composed of an inner ring having an inner ring raceway surface on an outer circumference thereof, an outer ring having an outer ring raceway surface on an inner circumference thereof, a plurality of rolling elements which roll between the inner ring raceway surface and the outer ring raceway surface, and a cage retaining the rolling elements. At least one bearing member selected from among the inner ring, the outer ring, the rolling elements, and the cage is made of an iron-based material. A hard film is formed on surfaces of the bearing members made of the iron-based material and on at least one surface selected from among the inner ring raceway surface, the outer ring raceway surface, the rolling contact surfaces of the rolling elements, and the sliding contact surface of the cage. The hard film has a structure composed of a first mixed layer, consisting mainly of chromium and WC, which is formed directly on the surfaces of the bearing members, a second mixed layer, consisting mainly of WC and DLC, which is formed on the first mixed layer, and a surface layer, consisting mainly of DLC, which is formed on the second mixed layer. In the first mixed layer, a content rate of the chromium becomes continuously or stepwise lower and that of the WC becomes continuously or stepwise higher from the surfaces of the bearing members toward a side of the second mixed layer. In the second mixed layer, a content rate of the WC becomes continuously or stepwise lower and that of the DLC becomes continuously or stepwise higher from a side of the first mixed layer toward a side of the surface layer. A content of hydrogen in the second mixed layer is set to 10 to 45 atomic percent.

The rolling elements are balls. The inner ring raceway surface and the outer ring raceway surface are circular curved surfaces which guide the rolling elements.

The rolling elements are balls. The sliding contact surface of the cage is a pocket surface which retains the balls thereon and allows the rolling elements to slide thereon.

The iron-based material forming the inner ring, the outer ring, and the rolling elements is high carbon chromium bearing steel, carbon steel, tool steel or martensitic stainless steel. A hardness of surfaces of the inner ring, the outer ring or the rolling elements on which the hard film is to be formed is set to not less than Hv 650 in Vickers hardness.

The iron-based material forming the cage is a cold-rolled steel plate, carbon steel, chromium steel, chromium molybdenum steel, nickel chromium molybdenum steel or austenitic stainless steel. A hardness of a sliding contact surface on which the hard film is to be formed is not less than Hv 450 in Vickers hardness.

A nitrided layer is formed on the surfaces on which the hard film is to be formed by subjecting the surfaces to nitriding treatment before the hard film is formed on the surfaces. As the nitriding treatment, plasma nitriding treatment is performed. A hardness of the surfaces subjected to the nitriding treatment is not less than 1000 in Vickers hardness Hv.

A surface roughness Ra of the surfaces of the inner ring, the outer ring or the rolling elements on which the hard film is to be formed is set to not more than 0.05 µm. A surface roughness Ra of the sliding contact surface of the cage on which the hard film is to be formed is set to not more than 0.5 µm.

Grease is packed in the rolling bearing.

Effect of the Invention

As described above, the hard film of the present invention has the structure composed of (1) the first mixed layer (ratio between compositions is gradient), consisting of the Cr and the WC, which is formed directly on the base material, (2) the second mixed layer (ratio between compositions is gradient) consisting of the WC and the DLC, and (3) the surface layer consisting of the DLC. Because the first mixed layer formed directly on the base material contains the Cr, the first mixed layer is compatible with the iron-based material and superior to the first mixed layer containing Al, W or the like in the adhesiveness thereof to the base material. In the above-described structure, the WC has the hardness and the modulus of elasticity intermediate between that of the Cr and that of the DLC. Thus by forming the first mixed layer and the second mixed layer as the composition ratio-gradient layer containing the Wc, the concentration of the residual stress hardly occurs after the hard film is formed. Because the first mixed layer and the second mixed layer are formed as the composition ratio-gradient layer, the different materials thereof are physically connected to each other. In addition, the content of hydrogen in the second mixed layer is set to 10 to 45 atomic percent. Thus, even though the hard film is formed at a portion to be subjected to a high contact stress, the hard film can be prevented from peeling off the base material over a long period of time.

The above-described structure allows the hard film of the present invention to be excellent in its peeling resistance, even though it is formed at a portion to be subjected to a high contact stress and thus allows the DLC film to display its intrinsic property. Consequently the hard film formed body of the present invention can be utilized for various uses as a member excellent in its wear resistance, corrosion resistance, and fretting resistance.

In the rolling bearing of the present invention, because the hard film having the above-described structure is formed on the bearing member made of the iron-based material, the hard film can be prevented from peeling off the raceway surface and the rolling contact surface to be subjected to a high contact stress and the sliding contact surface of the cage to be subjected to a strong impact force over a long period of time. In addition, the hard film having the above-described structure is excellent in its resistance to the peeling resistance, although the hard film is formed on curved surfaces such as the raceway surfaces of the inner and outer rings and the rolling contact surfaces of the rolling elements and the non-planar sliding contact surface of the cage. Consequently the rolling bearing of the present invention is excellent in its resistance to seizing, wear, and corrosion. Thus the raceway surfaces and the sliding contact surface of the cage are little damaged and have a long life, even though they are subjected to a severe lubrication state.

MODE FOR CARRYING OUT THE INVENTION

The hard film of the present invention has a three-layer structure composed of (1) a first mixed layer consisting mainly of Cr and WC (ratio between composition is gradient) formed at a base material-disposed side, (2) a second mixed layer consisting mainly of the WC and DLC (ratio between composition is gradient), and (3) a surface layer consisting of the DLC. The content of hydrogen in the second mixed layer is set to 10 to 45 atomic percent. The hard film formed body of the present invention consists of the base material and the hard film of the present invention formed on the surface of the base material.

As an embodiment of the present invention, a rolling bearing having a bearing member having the hard film formed on the surface thereof is described below. The bearing member is one example of the hard film formed body of the present invention. The rolling bearing of the present invention has the above-described bearing member.

In the rolling bearing of the present invention, at least one bearing member selected from among its inner ring, outer ring, rolling element, and cage is made of an iron-based material. The portions on which the hard film is to be formed are (1) surfaces of the bearing members made of the iron-based material. Among the surfaces thereof, the hard film is formed on (2) at least one surface selected from among the raceway surface of the inner ring, the raceway surface of the outer ring, the rolling contact surface of the rolling element, and the sliding contact surface of the cage. Most of these surfaces are not plane, but are mainly curved. It is preferable to form the hard film on contact surfaces of the bearing members made of the iron-based material.

Figure 1:
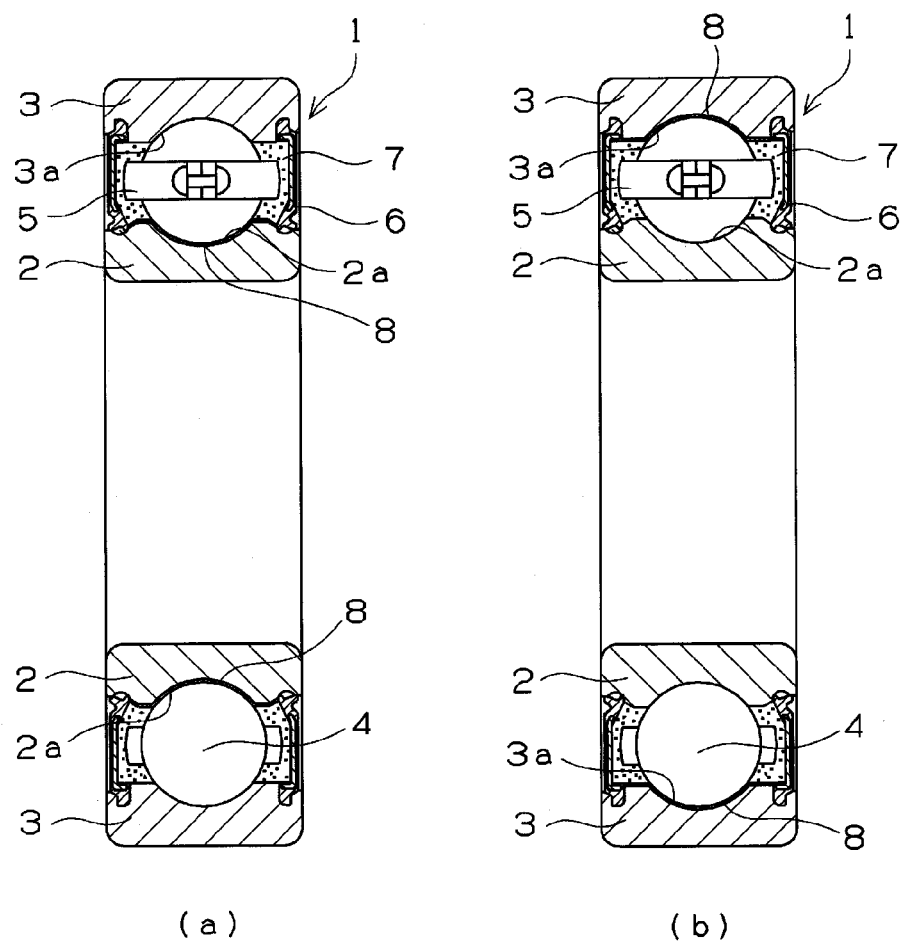
FIG. 1 is a sectional view showing an example of a rolling bearing of the present invention.
Figure 2:
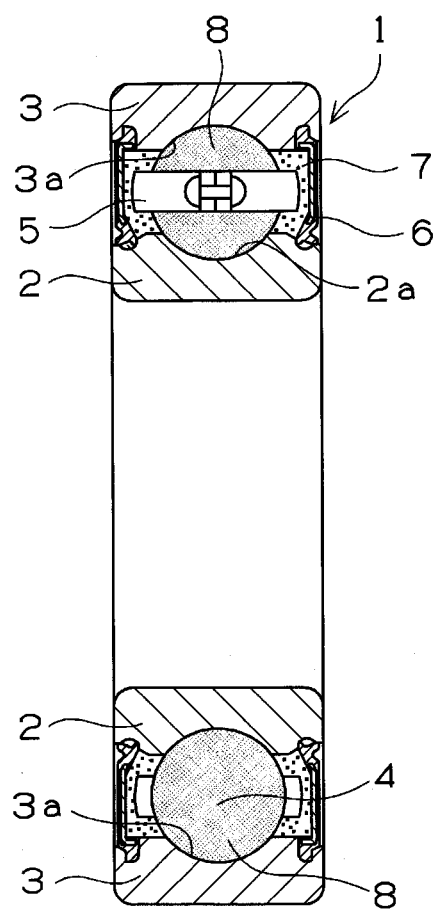
FIG. 2 is a sectional view showing another example of the rolling bearing of the present invention.
Figure 3:
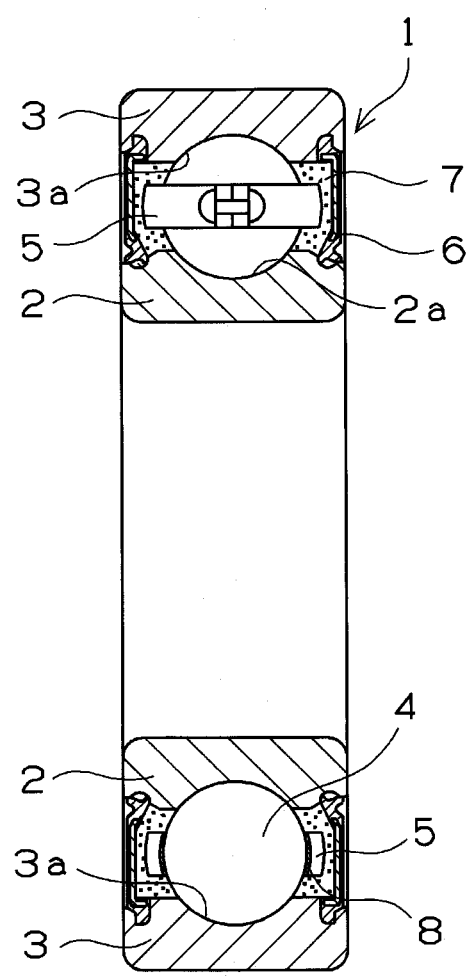
FIG. 3 is a sectional view showing still another example of the rolling bearing of the present invention.
Figure 4:
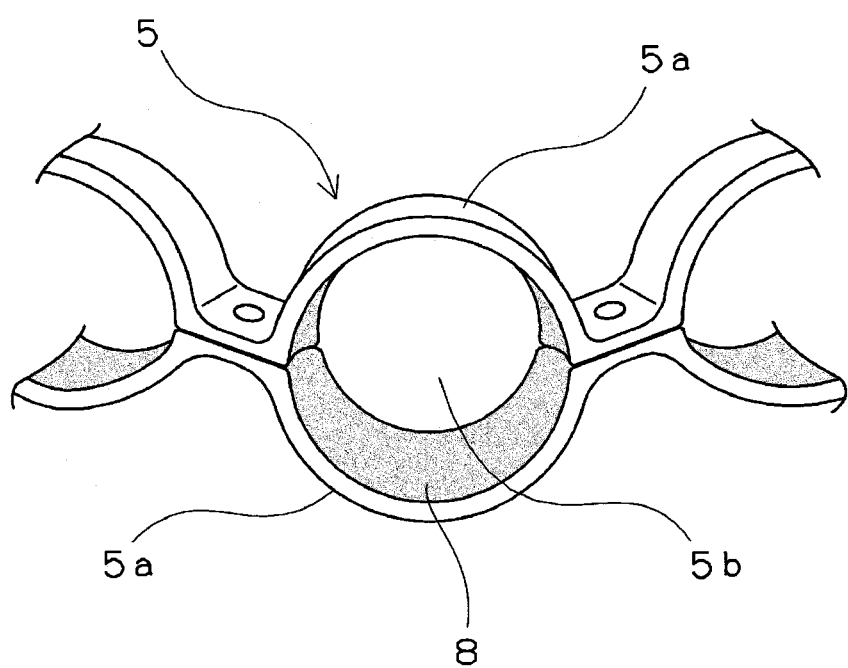
FIG. 4 is an enlarged view of a cage shown in FIG. 3.

The rolling bearing of the present invention is described below with reference to FIGS. 1 through 4. FIG. 1 shows a sectional view of the rolling bearing (deep groove ball bearing) having the hard film formed on a raceway surface of each of its inner ring and an outer ring. FIG. 2 shows a sectional view of the rolling bearing (deep groove ball bearing) having the hard film formed on the rolling contact surface of its rolling element. FIG. 3 shows a sectional view of the rolling bearing (deep groove ball bearing) having the hard film formed on the pocket surface of its cage. FIG. 4 shows an enlarged view of the cage shown in FIG. 3.

As shown in FIG. 1, a rolling bearing 1 has an inner ring having an inner ring raceway surface 2a on its outer circumference, an outer ring 3 having an outer ring raceway surface 3a on its inner circumference, and a plurality of rolling elements 4 which roll between the inner ring raceway surface 2a and the outer ring raceway surface 3a. A cage 5 retains the rolling elements 4 at regular intervals. A sealing member 6 seals an opening formed at each of axial ends of the inner and outer rings. Grease 7 is packed in a space of the rolling bearing. As the grease 7, it is possible to use known grease for use in the rolling bearing.

In the rolling bearing shown in FIG. 1(a), a hard film 8 is formed on the outer circumferential surface (raceway surface 2a of inner ring is included) of the inner ring 2. In the rolling bearing shown in FIG. 1(b), the hard film 8 is formed on the inner circumferential surface (raceway surface 3a of outer ring is included) of the outer ring 3. In the case where the hard film 8 is formed on the inner ring and outer rings, the hard film 8 should be formed on at least the raceway surface of each of the inner ring and outer rings. Thus as shown in each of FIGS. 1(a) and 1(b), the hard film 8 may be formed on the entire outer circumferential surface of the inner ring and the entire inner circumferential surface of the outer ring or entirely on the inner and outer rings.

In the rolling bearing shown in FIG. 2, the hard film 8 is formed on the rolling contact surface of each of the rolling elements 4. Because the rolling bearing shown in FIG. 2 is the deep groove ball bearing, the rolling elements thereof are balls, and the rolling contact surface of each of the rolling elements is entirely a spherical surface. In the case where the hard film 8 is formed on the rolling elements of a cylindrical roller bearing or those of a tapered roller bearing in using these roller bearings as the rolling bearing other than the one shown in the drawings, the hard film should be formed on at least the rolling contact surface (cylindrical outer circumference) of each of the rolling elements.

As shown in FIGS. 1 and 2, to guide balls which are the rolling elements 4, the raceway surface 2a of the inner ring of the deep groove ball bearing is formed as a circular curved surface which is circular arc groove-shaped in its axial sectional view. Similarly the raceway surface 3a of the outer ring of the deep groove ball bearing is a circular curved surface which is circular arc groove-shaped in the axial sectional view of the deep groove ball bearing. Supposing that the diameter of a steel ball is dw, the radius of curvature of the circular arc groove is 0.51 to 0.54 dw. In the case where the cylindrical roller bearing or the tapered roller bearing is used as the rolling bearing other than the one shown in the drawings, to guide balls of these bearings, the raceway surface of each of the inner ring and the outer ring is formed as a curved surface in at least the circumferential direction thereof. Because a barrel-shaped roller is used as the rolling element in the case of a self-aligning roller bearing, the raceway surface of each of the inner ring and the outer ring is formed as a curved surface in the axial direction thereof in addition to the circumferential direction thereof. The raceway surface of each of the inner ring and the outer ring of the rolling bearing of the present invention may have any of the above-described configurations.

The bearing members which are the inner ring 2, the outer ring 3, and the rolling elements 4 on which the hard film 8 is to be formed are made of the iron-based material. As the iron-based material, it is possible to use an arbitrary steel stock or the like generally used for a material of the bearing member. Examples of the materials of the bearing member include high carbon chromium bearing steel, carbon steel, tool steel, and martensitic stainless steel.

It is preferable to set the hardness of the surface of each of the inner ring 2, the outer ring 3 or the rolling element 4 on which the hard film is to be formed to not less than Vickers hardness of Hv 650. By setting the hardness of the surface thereof to not less than Vickers hardness of Hv 650, it is possible to decrease the difference between the hardness of the surface thereof and that of the hard film (foundation layer) and improve the adhesiveness of the former to the latter.

It is preferable to set a surface roughness Ra of the surface of the inner ring 2, the outer ring 3 or the rolling element 4 on which the hard film is to be formed to not more than 0.05 µm. In the case where the surface roughness Ra thereof exceeds 0.05 µm, it is difficult to form the hard film on the upper ends of the projections of irregularities of the surface of each of the above-described bearing members. Thereby the thickness of the formed hard film is locally small.

In the rolling bearing shown in FIG. 3, the hard film 8 is formed on the sliding contact surface of the cage 5. The other constructions of the rolling bearing shown in FIG. 3 are similar to those of the bearing shown in FIG. 1. As shown in FIG. 4, the cage 5 consists of a corrugated iron plate and is produced by combining two members 5a, 5a formed by press-molding an iron-based material to be described later with each other. The cage 5 has a cage pocket 5b retaining the balls which are the rolling element 4. The inner circumferential surface (pocket surface) of the cage pocket 5b is the sliding contact surface on which the rolling elements 4 slide. The hard film 8 is formed on the pocket surface. It is necessary to form the hard film 8 on at least one sliding contact surface selected from among the sliding contact surface between the pocket surface of the cage 5 and the bearing ring (inner ring 2 or outer ring 3) and the sliding contact surface between the pocket surface of the cage 5 and the rolling elements 4. The hard film may be formed on the raceway surface 2a of the inner ring, the raceway surface 3a of the outer ring, and the rolling contact surfaces of the rolling elements 4 shown in FIGS. 1 and 2 in addition to the sliding contact surface of the cage 5.

The cage 5 on which the hard film 8 is to be formed is made of the iron-based material. As the iron-based material, it is possible to use arbitrary materials generally used as materials of the cage. Examples of the iron-based material include a cold-rolled steel plate, carbon steel, chromium steel, chromium molybdenum steel, nickel chromium molybdenum steel, and austenitic stainless steel.

The hardness of the sliding contact surface of the cage 5 on which the hard film 8 is to be formed is favorably not less than Vickers hardness of Hv190 and more favorably not less than Hv450. By setting the Vickers hardness of the sliding contact surface thereof to not less than Hv450, it is possible to decrease the difference between the hardness of the sliding contact surface and that of the hard film (foundation layer) to a possible highest extent and improve the adhesiveness of the former to the latter.

It is preferable to set a surface roughness Ra of the sliding contact surface of the cage 5 on which the hard film 8 is to be formed to not more than 0.5 µm. In the case where the surface roughness Ra thereof exceeds 0.5 µm, the hard film formed at the upper ends of the projections of the irregularities of the sliding contact surface thereof is liable to peel therefrom owing to a local concentration of a stress when the rolling elements slide on the sliding contact surface of the cage and in addition, because it is difficult to sufficiently remove dirt from the sliding contact surface thereof, the hard film formed on the dirt may easily peel therefrom.

It is preferable to form a nitrided layer on the surface of each of the bearing members (inner ring, outer ring, rolling element, and cage) on which the hard film is to be formed by subjecting the surface thereof to nitriding treatment before the hard film 8 is formed on the surface thereof. As the nitriding treatment, it is preferable to subject the surface of the base material to plasma nitriding treatment because the plasma nitriding treatment makes it difficult for an oxidized layer which prevents the adhesiveness between the hard film and the surface of each of the bearing members. It is preferable that the hardness of the surface of each of the bearing members subjected to the nitriding treatment is not less than 1000 Hv in Vickers hardness to further improve the adhesiveness between the hard film (foundation layer) and the surface of each of the bearing members.

Figure 5:
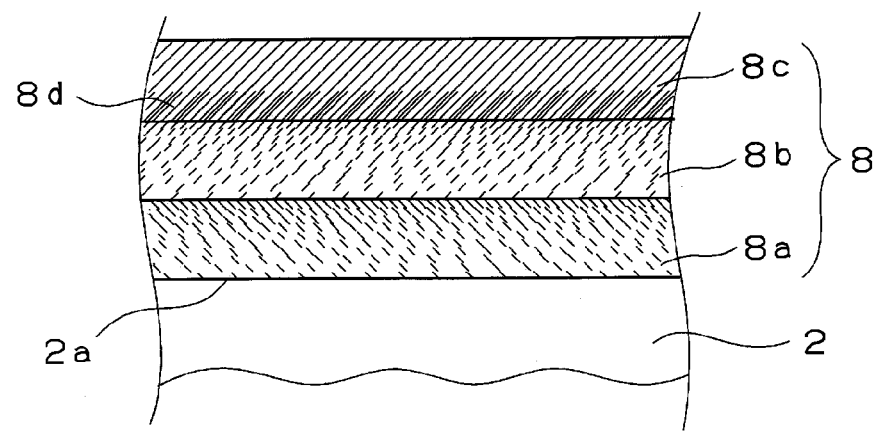
FIG. 5 is a sectional pattern diagram showing the structure of a hard film.

The structure of the hard film of the present invention is described below with reference to FIG. 5. FIG. 5 is a pattern sectional diagram showing the structure of the hard film 8 shown in FIG. 1(*a*). As shown in FIG. 5, the hard film 8 has a three-layer structure composed of (1) a first mixed layer 8a, consisting mainly of Cr and WC, which is formed directly on the raceway surface 2a of the inner ring 2 which is the base material, (2) a second mixed layer 8b, consisting mainly of WC and DLC, which is formed on the first mixed layer 8a, and (3) a surface layer 8c, consisting mainly of DLC, which is formed on the second mixed layer 8b. The residual stress remains in the hard film after it is formed on the base material. The magnitude of the residual stress greatly varies in dependence on a film structure, a film-forming condition, and the like. In the present invention, the structure of the hard film is composed of the above-described three layers to avoid a sudden change in the properties (hardness, modulus of elasticity, and the like) thereof.

The first mixed layer 8a is the foundation layer of the hard film to be formed directly on the raceway surface, rolling contact surface, and sliding contact surface of the cage all of which are the surfaces of the base materials. Because the first mixed layer 8a contains the Cr, the first mixed layer 8a is compatible with the bearing member (base material), made of the iron-based material, on which the first mixed layer 8a is to be formed. Thus the first mixed layer 8a containing the Cr is superior to the first mixed layer containing W, Ti or Si in the adhesiveness thereof to the base material. The first mixed layer 8a containing the Cr is excellent in the adhesiveness thereof to the high carbon chromium bearing steel to be used as a material of the bearing ring. The first mixed layer 8a containing the Cr is also compatible with a cemented carbide material. The WC to be used for the first mixed layer 8a has a hardness and a modulus of elasticity intermediate between that of the Cr and that of the DLC, and the concentration of the residual stress hardly occurs after the first mixed layer is formed.

Because the first mixed layer 8a is a composition ratio gradient layer in which the content rate of the Cr becomes lower and that of the WC becomes higher from the side of the inner ring 2 toward the side of the second mixed layer 8b, the first mixed layer 8a has an excellent adhesiveness to both the inner ring 2 and the second mixed layer 8b. The first mixed layer 8a has a structure in which the Cr and the WC are physically connected to each other. Thus it is possible to prevent the first mixed layer 8a from being broken. Further because the content rate of the WC becomes higher toward the side of the second mixed layer 8b, the first mixed layer 8a is excellent in its adhesiveness to the second mixed layer 8b.

The second mixed layer 8b is formed as the intermediate layer of the hard film interposed between the foundation layer and the surface layer thereof. As described above, the WC for use in the second mixed layer 8b has the hardness and the modulus of elasticity intermediate between that of the Cr and that of the DLC and makes it difficult for the residual stress to concentrate in the hard film after it is formed. Because the second mixed layer 8b is a composition ratio gradient layer in which the content rate of the WC becomes lower and that of the DLC becomes higher from the side of the first mixed layer 8a toward the side of the surface layer 8c, the second mixed layer 8b has an excellent adhesiveness to the first mixed layer 8a and the surface layer 8c. The second mixed layer 8b has a structure in which the WC and the DLC are physically connected to each other. Thus it is possible to prevent the second mixed layer 8b from being broken or the like. Further because the content rate of the DLC becomes higher toward the side of the surface layer 8c, the second mixed layer 8b is excellent in the adhesiveness to the surface layer 8c.

In the second mixed layer 8b, the DLC having a high non-adhesiveness can be connected to the first mixed layer 8a owing to an anchoring effect caused by the presence of the WC. To generate a high adhesiveness between the first mixed layer 8a and the second mixed layer 8b even in a severe condition in which the first mixed layer 8a and the second mixed layer 8b are fatigued by being subjected to a high impact force or a high contact pressure, the mechanical and fatigue properties of both the DLC and the WC of the second mixed layer 8b are considered important. Therefore the present inventors have made repeated experiments to optimize the film-forming condition of the second mixed layer (WC/DLC) and found that by setting the content of hydrogen in the second mixed layer excessively larger than in a normal sputtering condition, it is possible to conspicuously improve the peeling life length of the second mixed layer in an environment where the second mixed layer is fatigued by being subjected to a high impact force or in an environment where the second mixed layer is fatigued by being subjected to a rolling contact-caused high contact stress.

The content of hydrogen in the second mixed layer is set to favorably 10 to 45 atomic percent and more favorably 15 to 45 atomic percent. In the case where the content of hydrogen in the second mixed layer is less than 10 atomic percent, the second mixed layer has a sufficient mechanical property and thus has a high static adhesiveness to the first mixed layer, but has an inferior fatigue property. Thus the second mixed layer is liable to peel off the first mixed layer when the hard film is subjected to the rolling contact. On the other hand, in the case where the content of hydrogen in the second mixed layer exceeds 45 atomic percent, the second mixed layer has an insufficient mechanical property. As a result, the hard film is incapable of withstanding an impact force and a high contact pressure when the hard film is subjected to the rolling contact and is thus deformed to a high extent. As a result, a stress concentrates on the adjacent layers. Thus it is difficult for the hard film to have a long life.

"The content of hydrogen in the second mixed layer" in the present invention is the content of hydrogen (atomic percent) found by GDS analysis (glow discharge atomic emission spectrochemical analysis). The GDS analysis is capable of examining the relation between a depth direction and the content of an element content. By preparing a calibration curve of each element, the quantity thereof can be determined. The calibration curve of the hydrogen content was prepared by using ERDA analysis (elastic recoil detection analysis) capable of measuring the absolute quantity of hydrogen. Calibration curves of constituent elements other than hydrogen were prepared by using EDX analysis. The details are shown below.

Figure 13:
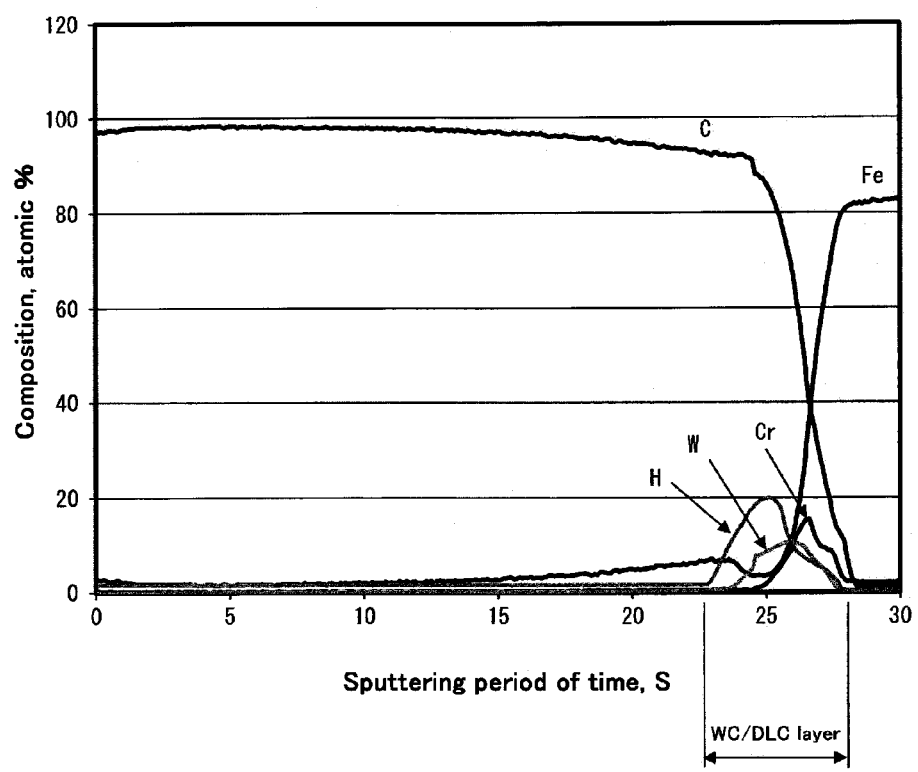
FIG. 13 shows an example of results of GDS analysis.
Figure 14:
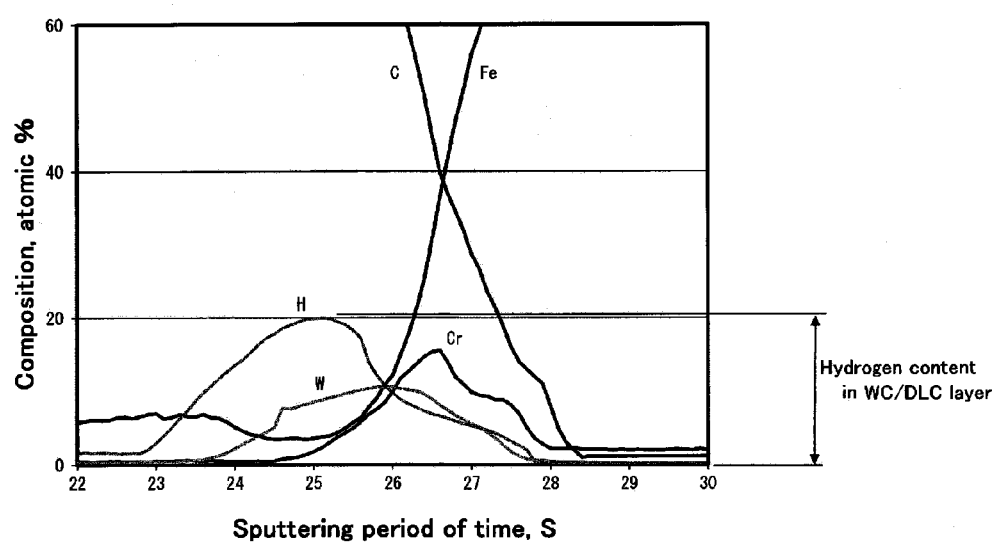
FIG. 14 is an enlarged view of a second mixed layer (WC/DLC layer) in FIG. 13.

FIG. 13 shows an example of results of the GDS analysis. FIG. 14 is an enlarged view of the second mixed layer (WC/DLC layer) in FIG. 13. A sputtering period of time shown along the axis of abscissa shows a depth from the surface of the second mixed layer. The peak of C and that of W coexist in the range of the WC/DLC layer. The maximum value (atomic percent) of the peak of hydrogen in the range in which the peak of C and that of W coexist is defined as "the content of hydrogen in the second mixed layer" in the present invention. The "atomic percent" shown along the axis of ordinate is computed from a hydrogen content output value (V) in the GDS analysis by using a method described below.

Figure 15:
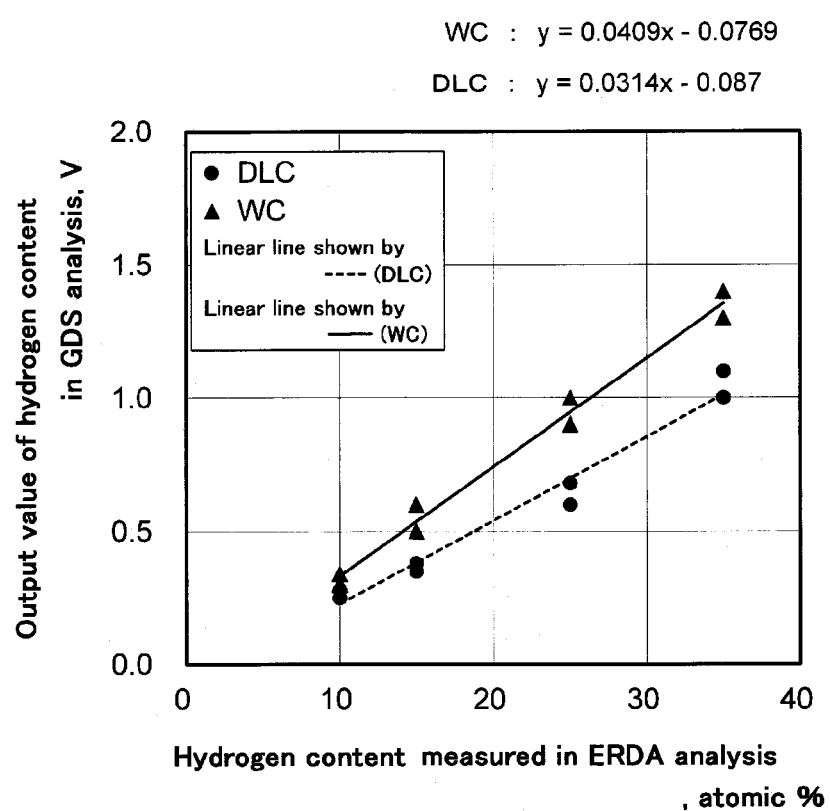
FIG. 15 shows the relationship (calibration curve) between an output value of a hydrogen content in the GDS analysis and a hydrogen content measured in ERDA analysis.

Because the hydrogen content output value (V) in the GDS analysis varies according to the material of a specimen, it is necessary to prepare a calibration curve of the hydrogen content for each of the DLC and the WC composing the second mixed layer (WC/DLC layer). Thus specimens of a DLC single layer film having different hydrogen contents and specimens of a WC single layer film also having different hydrogen contents were prepared by adjusting the introduction amount of methane gas in a condition which meets the film-forming condition of the WC/DLC layer to perform the ERDA analysis and the GDS analysis. FIG. 15 shows one example of the relation (calibration curve) between the hydrogen content output value (V) in the GDS analysis and the hydrogen content (atomic percent) measured in the ERDA analysis. FIG. 15 indicates that the output value of the hydrogen content in the GDS analysis has a linear relationship with the hydrogen content. The hydrogen content determined by using the DLC calibration curve of the hydrogen content and that found by using the WC calibration curve of the hydrogen content are different from each other. Thus by taking an average of the hydrogen contents determined by using both calibration curves, it is possible to compute the hydrogen content (atomic percent) corresponding to an arbitrary hydrogen content output value (V).

The surface layer 8c consists mainly of the DLC. It is preferable that the surface layer 8c has a relaxing layer 8d disposed at the side adjacent to the second mixed layer 8b. The relaxing layer is formed by continuously or stepwise changing at least one of parameters (introduction amount of hydrocarbon-based gas, vacuum degree, and bias voltage) relating to the film-forming condition of the second mixed layer 8b and those relating to the film-forming condition of the surface layer 8c to avoid a sudden change of the parameters, when the parameters are different from each other. In more detail, a parameter relating to the film-forming condition at a time when the outermost surface of the second mixed layer 8b is formed is set as a starting point, and a parameter relating to a final film-forming condition of the surface layer 8c is set as a termination point. Each of the parameters is changed continuously or stepwise within this range. Thereby there is no rapid difference between the properties (hardness, modulus of elasticity, and the like) of the second mixed layer 8b and those of the surface layer 8c and thus the adhesiveness therebetween becomes further excellent. By increasing the bias voltage continuously or stepwise, the component ratio between a graphite structure ($sp^2$) of a DLC structure and a diamond structure ($sp^3$) thereof inclines toward the latter. Thereby the hardness of the surface layer becomes gradient (rises).

It is preferable to set the thickness of the hard film (total of three layers) 8 to 0.5 μm to 3.0 μm. When the thickness of the hard film is less than 0.5 μm, there are cases in which the hard film is inferior in its wear resistance and mechanical strength. When the thickness of the hard film is more than 3.0 μm, it is liable to peel off the surface of the base material. It is also preferable to set the ratio of the thickness of the surface layer 8c to that of the hard film 8 to not more than 0.7. When the above-described ratio exceeds 0.7, the gradient tissue for physically connecting the WC of the second mixed layer 8b and the DLC thereof to each other is liable to be uncontinuous. Thereby there is a high possibility that the adhesiveness between the surface layer 8c and the second mixed layer 8b deteriorates.

By composing the hard film 8 of the three layers consisting of the first mixed layer 8a, the second mixed layer 8b, and the surface layer 8c, the hard film 8 is excellent in its peeling resistance.

As the properties of the hard film 8, it is preferable to set a specific wear amount of the hard film is less than $200 \times 10^{-10}$ mm$^3$/(N·m) when a mating material consisting of a SUJ2 quenched steel having a surface roughness Ra of not more than 0.01 μm and Vickers hardness Hv of 780 is rotated at a rotational speed of 0.05 m/s for 30 minutes with the hard film in contact with the mating material by applying a load of 0.5 GPa in a Hertzian maximum contact surface pressure to the hard film. The surface roughness of the mating material is low. Thus the form of the frictional wear test is an adhesion wear form similar to a wear form inside the bearing. When the specific wear amount of the hard film is less than $200 \times 10^{-10}$ mm$^3$/(N·m) in the test, the hard film is excellent in its wear resistance and is capable of preventing the generation of abrasion powder. In addition the hard film is effective for decreasing wear against local sliding generated on the raceway surface and the sliding contact surface of the cage.

It is preferable that in the hard film, the sum of the average value of indentation hardnesses and a standard deviation value is 25 to 45 GPa. In this range, a high effect can be displayed for preventing abrasive wear generated when a hard foreign matter enters the raceway surface and the sliding contact surface of the cage.

It is preferable that a critical peeling load of the hard film in a scratch test is not less than 50 N. The method of measuring the critical peeling load in the scratch test is carried out as shown in the examples described below. When the critical peeling load is less than 50 N, there is a high possibility that the hard film peels off the surface of the bearing member of the bearing when the bearing is operated in a high load-applied condition. Even though the critical peeling load is not less than 50 N, the hard film may easily peel off the surface of the bearing member unless the hard film has the membrane structure of the present invention.

By forming the hard film having the above-described structure and properties on the bearing member of the rolling bearing of the present invention, the hard film can be prevented from wearing and peeling off the base material even in a case where the bearing in operation is subjected to a load (high contact stress) such as rolling contact and even in a case where the bearing is subjected to an impact force or a local sliding contact-caused thermal impact. Thereby even in a severe lubricated condition, the raceway surface, the sliding contact surface of the cage, and the like are little damaged and have a long life. When a newly formed metal surface is exposed in a rolling bearing in which grease has been packed, the deterioration of the grease is accelerated by catalytic action. But in the rolling bearing of the present invention, the hard film is capable of preventing metallic contact-caused damage of the raceway surface, the rolling contact surface, and the sliding contact surface of the cage. Thereby it is possible to prevent the deterioration of the grease.

The method of forming the hard film is described below. The hard film is obtained by forming the first mixed layer 8a on the surface of the bearing member on which the hard film is to be formed, the second mixed layer 8b on the first mixed layer 8a, and the surface layer 8c on the second mixed layer 8b.

Figure 6:
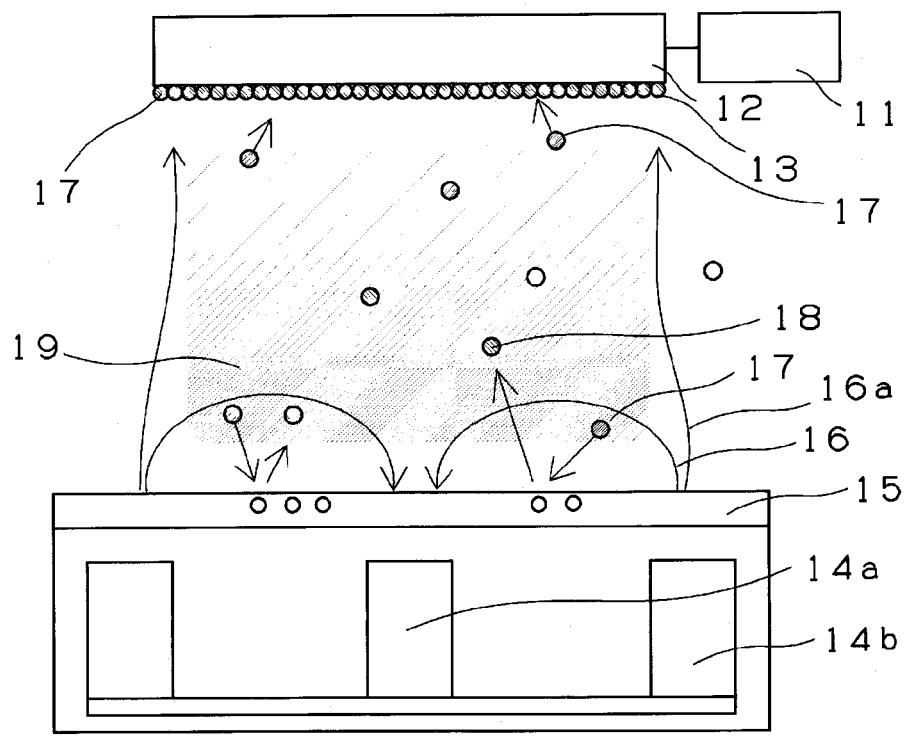
FIG. 6 is a pattern diagram showing a film-forming principle of a UBMS method.

It is preferable to form the surface layer 8c by using a UBMS apparatus using Ar gas as a sputtering gas. The film formation principle of a UBMS method to be carried out by using the UBMS apparatus is described below by a pattern diagram shown in FIG. 6. In FIG. 6, a base material 12 of the bearing member which is the inner ring, the outer ring, the rolling element, or the case on which the hard film is to be formed. The base material is illustratively shown as a flat plate. As shown in FIG. 6, the UBMS apparatus has an inner magnet 14a and an outer magnet 14b having different magnetic properties in the central portion of a round target 15 and the peripheral portion thereof. While a high-density plasma 19 is being formed in the neighborhood of the target 15, a part 16a of magnetic field lines 16 generated by the magnets 14a and 14b diffuses to the neighborhood of the base material 12 connected to a bias power source 11. It is possible to obtain an effect that Ar plasma generated at a sputtering time along the magnetic field lines 16a diffuses to the neighborhood of the base material 12. In the UBMS method, a dense film (layer) 13 can be formed owing to an ion assist effect that Ar ions and electrons allow ionized targets 18 to reach the base material 12 along the magnetic field lines 16a which diffuse to the neighborhood of the base material 12 more than normal sputtering methods.

It is preferable to form the surface layer 8c by utilizing the UBMS apparatus in such a way that carbon atoms generated from a carbon supply source consisting of the graphite target and the hydrocarbon-based gas used in combination is deposited on the second mixed layer 8b in conditions in which the ratio of the amount of the hydrocarbon-based gas to be introduced into the UBMS apparatus is set to 1 to 5 to 100 which is the amount of the Ar gas to be introduced thereinto, the vacuum degree inside the UBMS apparatus is set to 0.2 to 0.8 Pa, and the bias voltage to be applied to the bearing member which is the base material is set to 70 to 150V. These preferable conditions are described below.

By using the graphite target and the hydrocarbon-based gas in combination as the carbon supply source, it is possible to improve the adhesiveness between the surface layer 8c and the second mixed layer 8b. As the hydrocarbon-based gas, it is possible to use methane gas, acetylene gas, and benzene. Although the hydrocarbon-based gas is not limited to a specific one, the methane gas is preferable from the standpoint of cost and handleability.

By setting the ratio of the amount of the hydrocarbon-based gas to be introduced into the UBMS apparatus to 1 to 5 (part by volume) to 100 (part by volume) which is the amount of the Ar gas to be introduced thereinto (into film-forming chamber), it is possible to improve the adhesiveness between the surface layer 8c and the second mixed layer 8b without deteriorating the wear resistance of the surface layer 8c.

As described above, the vacuum degree inside the UBMS apparatus (inside the film-forming chamber) is set to favorably 0.2 to 0.8 Pa and more favorably 0.25 to 0.8 Pa. When the vacuum degree inside the UBMS apparatus is less than 0.2 Pa, the amount of the Ar gas inside the chamber is small. Thereby there is a case in which the Ar plasma is not generated and thus the film cannot be formed. When the vacuum degree inside the UBMS apparatus is more than 0.8 Pa, there is a fear that a reverse sputtering phenomenon is liable to occur and thus the wear resistance of the formed film deteriorates.

As described above, the bias voltage to be applied to the bearing member which is the base material is set to favorably 70 to 150V and more favorably 100 to 150V. When the bias voltage to be applied to the bearing member is less than 70V, densification does not progress and thus the wear resistance of the formed film deteriorates extremely, which is unpreferable. When the bias voltage to be applied to the bearing member is more than 150V, the reverse sputtering phenomenon is liable to occur, and thus there is a fear that the wear resistance of the formed film deteriorates. When the bias voltage to be applied thereto is too high, the surface layer becomes so hard that there is a feat that the surface layer is liable to peel off the second mixed layer 8b when the bearing is in operation.

The introduction amount of the Ar gas serving as the sputtering gas is favorably 40 to 150 ml/minute and more favorably 50 to 150 ml/minute. When the flow rate of the Ar gas is less than 40 ml/minute, there is a case in which the Ar plasma is not generated and the film cannot be formed. When the flow rate of the Ar gas is more than 150 ml/minute, the reverse sputtering phenomenon is liable to occur, and thus there is a fear that the wear resistance of the formed film deteriorates. When the introduction amount of the Ar gas is large, there is an increase in the probability of collision between Ar atoms and carbon atoms inside the film-forming chamber. As a result, there is a decrease in the number of the Ar atoms which reach the upper surface of the film, with the result that the effect of hardening the film by means of the Ar atoms deteriorates, and thus the wear resistance of the formed film deteriorates.

It is preferable to form the first mixed layer 8a and the second mixed layer 8b by using the UBMS apparatus using the Ar gas as the sputtering gas. In forming the first mixed layer 8a, a Cr target and a WC target are used in combination as the target 15. In forming the second mixed layer 8b, (1) the WC target and (2) the graphite target and the hydrocarbon-based gas are used. The target is replaced one by one in forming each layer.

The first mixed layer 8a is formed continuously or stepwise by increasing a sputtering power to be applied to the WC target and decreasing an electric power to be applied to the Cr target. Thereby it is possible to form the composition ratio-gradient layer in which the content rate of the Cr becomes lower and the content rate of the WC becomes higher toward the side of the second mixed layer 8b.

The second mixed layer 8b is formed continuously or stepwise by increasing a sputtering power to be applied to the graphite target serving as the carbon supply source and decreasing an electric power to be applied to the WC target. Thereby it is possible to form the composition ratio-gradient layer in which the content rate of the WC becomes lower and the content rate of the DLC becomes higher toward the side of the surface layer 8c.

To set the content of hydrogen in the second mixed layer 8b to the above-described range (10 to 45 atomic percent), the graphite target and the hydrocarbon-based gas are used in combination as the carbon supply source, and the rate of the amount of the hydrocarbon-based gas to be introduced into the UBMS apparatus is set larger than the amount of the hydrocarbon-based gas to be introduced thereinto in a normal sputtering condition. For example, the ratio of the amount of the hydrocarbon-based gas to be introduced into the UBMS apparatus is set to 5 to 40 and favorably 10 to 40 (part by volume) to 100 (part by volume) which is the amount of the Ar gas to be introduced thereinto (inside film-forming chamber). Other conditions such as the degree of vacuum inside the UBMS apparatus and the bias voltage, and the like at the time when the second mixed layer is formed are similar to the above-described preferable film-forming conditions to be used in forming the surface layer.

The residual stress remains in the hard film such as the DLC film after it is formed. The magnitude of the residual stress greatly varies in dependence on a film structure, a film-forming condition, and a base material configuration. As a result of repeated experiments, it has been revealed that the residual stress is greatly affected by the configuration of the base material. For example, when a hard film is formed on a flat surface of the base material, it does not peel therefrom and has a large critical peeling load in a scratch test immediately after it is formed thereon, whereas when it is formed on a curved surface such as raceway surfaces of inner and outer rings of a rolling bearing and a pocket surface of a cage thereof, it may peel therefrom immediately after it is formed thereon. Even though the hard film does not peel off the curved surface immediately after it is formed thereon, the hard film is liable to peel therefrom while the rolling bearing is in operation. As a result of earnest studies, the present inventors have found that by limiting the structure of the hard film to be formed on the curved surface such as the raceway surfaces of the inner and outer rings of the rolling bearing, rolling contact surfaces of rolling elements thereof, and the sliding contact surface (pocket surface and the like) of the cage thereof to a predetermined structure composed of (1) the first mixed layer consisting of the Cr/WC (composition ratio is gradient), (2) the second mixed layer of the WC/DLC (composition ratio is gradient), and (3) the surface layer consisting of the DLC) and by setting the content of hydrogen of the second mixed layer to the predetermined range, as described above, it is possible to greatly improve the peeling resistance of the hard film even when the hard film is subjected to a high contact stress and prevent the hard film from peeling off the surfaces of the bearing members.

Although the bearing member has been exemplified as the hard film formed body of the present invention, the hard film formed body is not limited thereto. As materials for the base material, a cemented carbide material can be also used in addition to the iron-based material for use in the bearing member. Examples of the cemented carbide material include a WC—TiC—Co based alloy, a WC—TaC—Co based alloy, and a WC—TiC—TaC—Co based alloy all of which are improved in the oxidation resistance in addition to a WC—Co based alloy most excellent in its mechanical property.

The hard film formed body of the present invention can be used for sliding members such as the bearing members, dies, tools, abrasive materials, magnetic and optical parts, and portions where high wear resistance and peeling resistance are required. The preferable range of each of the hardness and roughness of the base material, film-forming condition, and the like of the hard film formed body to be used for applications other than the above-described bearing members and the like is similar to that of the above-described bearing member.

EXAMPLES

Formation of Film on Inner and Outer Rings

The hard films of the present invention were formed on predetermined base materials to evaluate the properties of the hard films. Similar hard films were formed on the raceway surfaces of inner rings of rolling bearings and the raceway surfaces of outer rings thereof to evaluate the properties of the rolling bearings.

The base materials used to evaluate the hard films, the UBMS apparatus, and the sputtering gas are as described below.

(1) Base materials: shown in tables.
(2) Dimensions of base materials: disks ($\phi$48 mm×$\phi$8 mm×7 mm, films were formed on plane surfaces) having surface roughnesses shown in the tables.
(3) UBMS apparatus: UBMS202/AIP composite apparatus produced by Kobe Steel, Ltd.
(4) Sputtering gas: Ar gas The condition of forming the first mixed layer (foundation layer of hard film) is described below. The inside of a film-forming chamber was vacuumed to about $5\times10^{-3}$ Pa, and the base materials were baked by a heater. After the surfaces of the base materials were etched by means of Ar plasma, the sputtering power to be applied to the Cr target and that to be applied to the WC target were adjusted to form a layer in which the composition ratio between the Cr and the WC was gradient. The bias voltage applied to the base materials was 150V. In this layer, the content rate of the Cr becomes lower and that of the WC becomes higher from the side of the base material toward the side of the second mixed layer. In forming the first mixed layers consisting of substances other than the Cr and the WC, the first mixed layers were formed in the same condition as the condition in which the above-described first mixed layer was formed except that targets corresponding to the substances other than the Cr and the WC were used.

The condition of forming the second mixed layer (intermediate layer of hard film) is described below. The inside of the film-forming chamber was vacuumed to about $5\times10^{-3}$ Pa. After the surfaces of the base materials (or the surfaces the above-described foundation layers) were etched by means of the Ar plasma, the sputtering power to be applied to the WC target and that to be applied to the graphite target were adjusted to form a layer in which the composition ratio between the WC and the DLC was gradient, while methane gas which is a hydrocarbon-based gas was being supplied to the film-forming chamber. The bias voltage applied to the base materials was 150V. In this layer, the content rate of the WC becomes lower and that of the DLC becomes higher from the side of the first mixed layer toward the side of the surface layer. The hydrogen content (atomic percent) in the second mixed layer was found by using the above-described method and the GDS analysis (glow discharge atomic emission spectrochemical analysis). The ratios of the methane gas introduced into the UBMS apparatus are as shown in the tables.

The condition of forming the surface layer is as shown in the tables.

Figure 7:
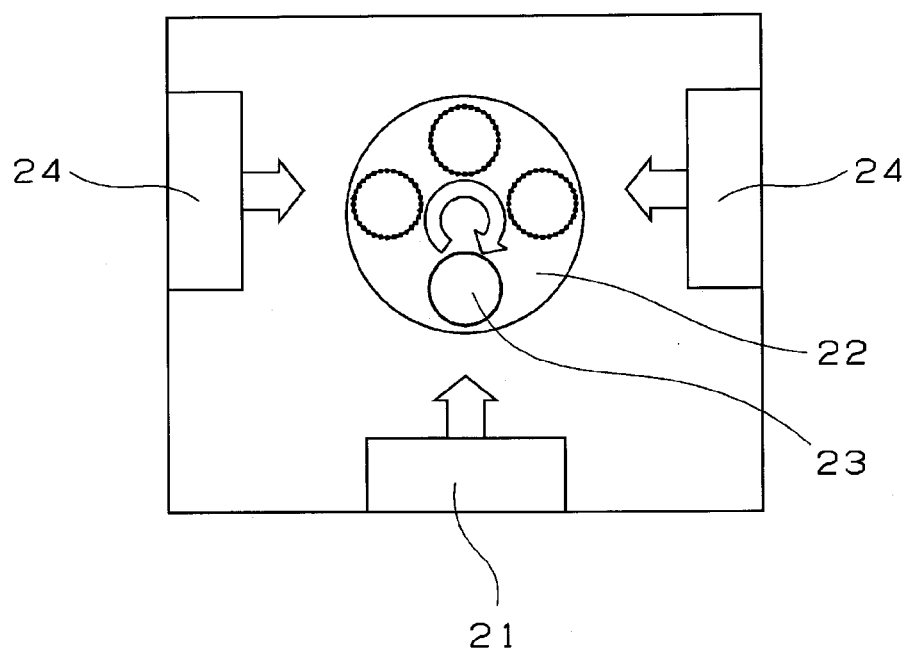
FIG. 7 is a pattern diagram of a UBMS apparatus having an AIP function.

FIG. 7 shows the outline of the UBMS202/AIP composite apparatus. FIG. 7 is a pattern diagram of the UBMS apparatus having an arc ion plating (hereinafter referred to as AIP) function. As shown in FIG. 7, the UBMS202/AIP composite apparatus has the AIP function of forming a film by instantaneously vaporizing and ionizing an AIP vaporization source material 21 by utilizing a vacuum arc discharge and depositing the vaporized and ionized AIP vaporization source material 21 on a base material 23 disposed on a disk 22 and has a UBMS function capable of controlling the property of a film deposited on the base material by increasing a plasma density in the neighborhood of the base material 23 to increase an ion assist effect (see FIG. 6), with a sputtering vaporization source material (target) 24 being subjected to an unbalanced magnetic field. This apparatus is capable of forming a composite film composed of an AIP film and a plurality of UBMS films (ratio between compositions is gradient) combined arbitrarily with each other on the base material. In this example, the first mixed layer, the second mixed layer, and the surface layer were formed as the UBMS film on the bearing member (inner ring, outer ring) which is the base material. The raceway surface of the outer ring is positioned on the inner circumference of the outer ring. The UBMS film is formed on the raceway surface of the outer ring by means of the ionized target which is sputtered around the raceway surface of the outer ring.

Examples A1 through A10, A12, Comparative Examples A1 through A7, and Reference Examples A1 through A9

After the base materials shown in tables 1 through 3 were ultrasonically cleaned with acetone, the base materials were dried. After they were dried, they were mounted on the UBMS/AIP composite apparatus to form the first mixed layer and the second mixed layer both made of the materials shown in the tables in the above-described film-forming condition. The DLC film was formed on the second mixed layer as the surface layer in the film-forming conditions shown in the tables to obtain specimens each having a hard film. "Vacuum degree" shown in the tables means a vacuum degree inside the film-forming chamber of the above-described apparatus. The obtained specimens were subjected to a wear test, a hardness test, a film thickness test, a scratch test, and a thrust type rolling fatigue test (except reference examples). Results are shown in the tables. Reference numerals 1) through 7) shown below the table 1 apply to the tables 2 through 7.

Example A11

After base material (Vickers hardness of Hv 1000) subjected to plasma nitriding treatment by using a radical nitriding apparatus produced by Japan Electronics Industry Co., Ltd was ultrasonically cleaned with acetone, the base material was dried. After it was dried, it was mounted on the UBMS/AIP composite apparatus to form the first mixed layer (Cr/WC) and the second mixed layer (WC/DLC) both made of the materials shown in the table 1 in the above-described film-forming condition. The DLC film was formed on the second mixed layer as the surface layer in the film-forming condition shown in the table 1 to obtain a specimen having a hard film. The obtained specimen was subjected to tests similar to those conducted on the specimen of the example A1. Results are shown in the table 1.

<Friction and Wear Test>

Figure 8:
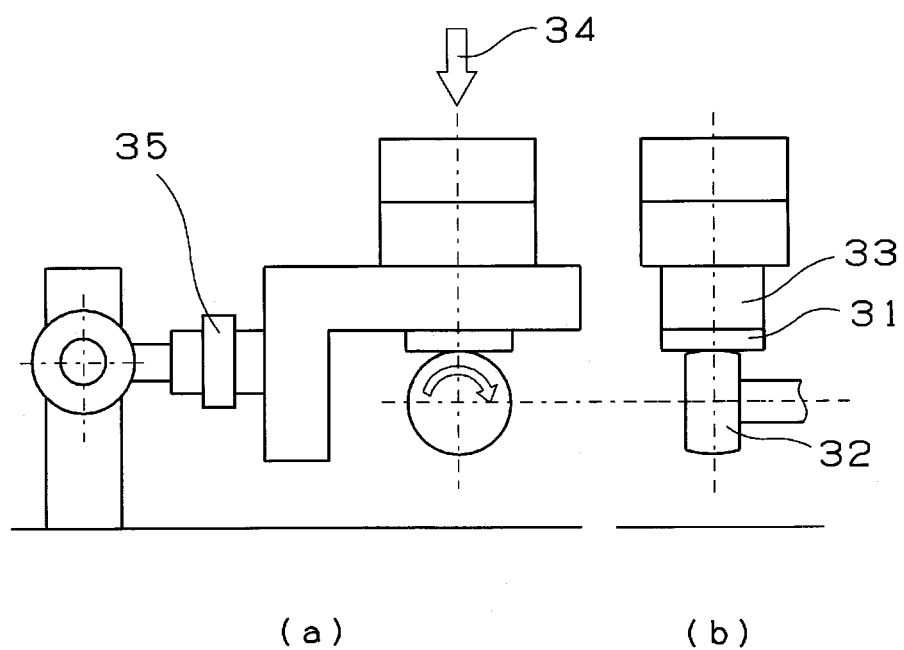
FIG. 8 shows a friction testing machine.

A friction test was conducted on the obtained specimens by using a friction testing machine shown in FIG. 8. FIGS. 8 (a) and 8(b) show a front view and a side view respectively. A mating material 32 consisting of a SUJ2 quenched steel having a surface roughness Ra not more than 0.01 μm and Vickers hardness Hv of 780 was mounted on a rotational shaft. The mating material 32 was rotated at a rotational speed of 0.05 m/s for 30 minutes without interposing a lubricant between the specimen 31 and the mating material 32 in conditions in which a Hertzian maximum contact surface pressure was 0.5 GPa and a room temperature was 25° C. with a predetermined load 34 being applied to the specimen 31 fixed to an arm portion 33 from above in FIG. 8. A frictional force generated between the specimen 31 and the mating material 32 was detected by a load cell. The specific wear amount of each specimen was computed from the obtained frictional force.

<Hardness Test>

The indentation hardness of each of the obtained specimens was measured by using a nano indenter (G200) produced by Agilent Technologies, Inc. Each of the measured values shows the average value of depths (position where hardness was uniform) not influenced by the surface roughness. The depth of each specimen was measured at 10 positions.

<Film Thickness Test>

The film thickness of each of the obtained specimens was measured by using a surface configuration-roughness measuring instrument (Form• Talysurf PG1830 produced by Taylor Hobson Ltd.). To determine the film thickness of each specimen, a film-formed portion was partly masked, and the difference in level between a film-unformed portion and the film-formed portion was computed.

<Scratch Test>

A scratch test was conducted on each of the obtained specimens by using a Rebetest RST produced by Nanotech Co., Ltd. to measure the critical peeling load of each specimen. More specifically, the test was conducted on each specimen by using a diamond indenter having a radius of 200 μm at its tip at a scratch speed of 10 mm/minute and a load application speed of 10 N/mm (load was successively increased). Determination was made on the screen of a testing machine: a load at which an exposed area of the base material reached 50% of a friction trace (length in friction direction: 375 μm, width: about 100 μm) on the screen was measured as the critical peeling load of each specimen.

<Thrust Type Rolling Fatigue Test>

Figure 9:
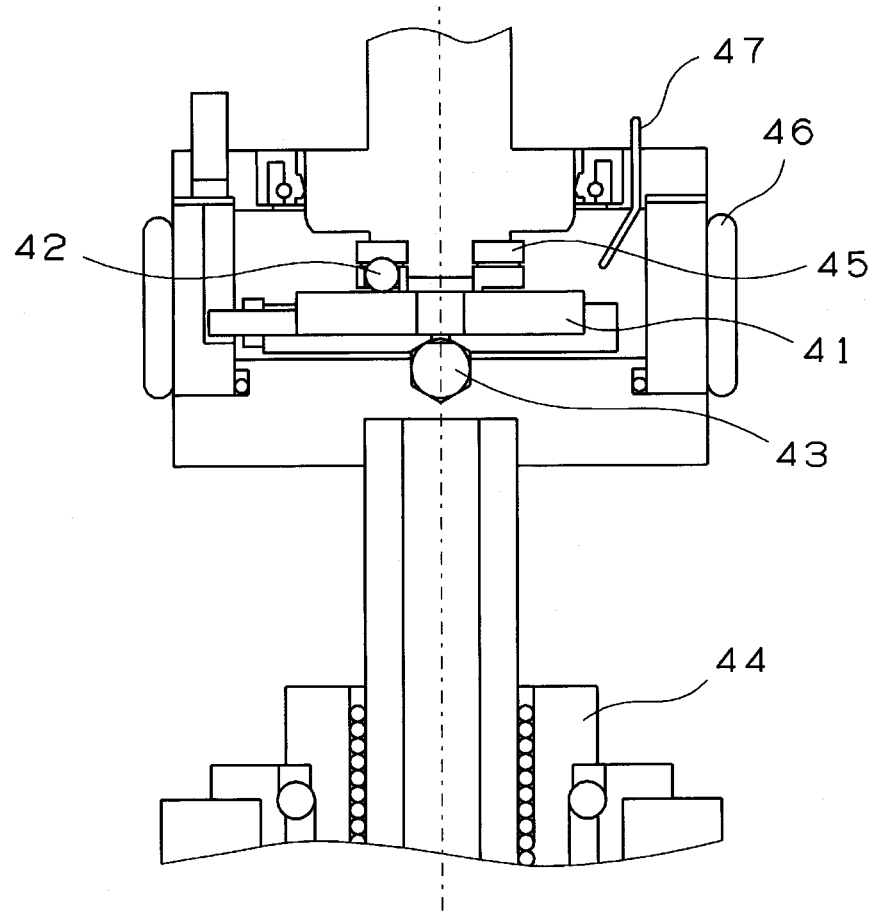
FIG. 9 shows a machine to be used in a thrust type rolling fatigue test.

A thrust type rolling fatigue test was conducted on each of the obtained specimens (φ48 mm×φ8 mm×7 mm) by using a testing machine shown in FIG. 9. As the thrust type rolling fatigue test, tests were conducted in a "low lambda condition" in which the lubrication state of the bearing was supposed to be severe and in a "high lambda condition" in which the lubrication state thereof was supposed to be favorable to evaluate the rolling fatigue property of each hard film. In the "low lambda condition", the bearing is subjected to a boundary lubrication. Thus in addition to a pure repeated rolling fatigue, contact-caused damage has an influence on the rolling fatigue property of each hard film. Therefore the wear resistance of the hard film and the adhesiveness thereof to the base material are demanded. The contents of the "low lambda condition" and those of the "high lambda condition" are shown below.

[Low Lambda Condition]
Lubricating oil: VG2
Lambda: 0.6
Maximum contact surface pressure: 2 GPa
Number of rotations: 1000 r/minute
Raceway diameter: φ20 mm
Rolling element: size: 7/32", number of pieces: three, material: SUJ2, hardness Hv: 750, and surface roughness: 0.005 μmRa
Temperature of oil: 70° C.
Cutoff time: not set
(number of load-applied times: eighth power in 1111 hours)

[High Lambda Condition]
Lubricating oil: VG32
Lambda: 9.2
Maximum contact surface pressure: 3.5 GPa
Number of rotations: 4500 r/minute
Raceway diameter: φ20 mm
Rolling element: size: 7/32", number of pieces: three, material: SUJ2, hardness Hv: 750, and surface roughness: 0.005 μmRa
Temperature of oil: 70° C.
Cutoff time: 300 hours
(Number of load-applied times: eighth power in 247 hours)

As shown in FIG. 9, the testing machine is so constructed that a rolling element 42 rolls between a disk-shaped specimen 41 and a bearing washer (51201) 45 and that the specimen 41 is supported via an aligning ball 43. In FIG. 9, a reference numeral 44 denotes a rotary ball spline for precompression, a reference numeral 46 denotes a heater, and a reference numeral 47 denotes a thermocouple. The testing machine is so constructed that the trace of rolling does not misalign, when the specimen 41 is re-mounted on the aligning ball 43. In the evaluation method, each specimen is removed therefrom at an interval of 20 hours which is the predetermined test period of time to check whether hard films have peeled off the specimens respectively by means of optical microscopic observation. For example, when a hard film has peeled off the specimen in the checking at the elapse of 20 hours, the life length thereof is 20 hours. When a hard film has not peeled therefrom in the checking at the elapse of 20 hours, the specimen is re-mounted on the aligning ball 43 to continue the test. The life lengths of the hard films are shown in tables 1 and 2. As the determination criterion of the life length of each hard film in the low lambda condition, hard films having a life length not less than 1500 hours are recorded as "○" and those having a life length less than 1500 hours are recorded as "x". As the determination criterion of the life length of each hard film in the high lambda condition, those having a life length not less than 300 hours are recorded as "○", whereas those having a life length less than 300 hours are recorded as "x".

<Test of Formation of Film on Inner and Outer Rings of Bearing>

Hard films were formed on raceway surfaces of inner and outer rings of a 6206 rolling bearing (deep groove ball bearing) shown below in the conditions of the examples and the comparative examples. Whether the hard films peeled off the bearing members immediately after the hard films were formed on the raceway surfaces of inner and outer rings was checked. Specimens in which the hard films did not peel off the bearing members when they were taken out of the film-forming chamber were recorded as "○", whereas specimens in which the hard films peeled off the bearing members when they were taken out of the film-forming chamber were recorded as "x". Tables show the results.

Inner ring: A hard film was formed on its raceway surface. Material: SUJ2, hardness Hv: 750, surface roughness: 0.03 μmRa Outer ring: A hard film was formed on its raceway surface. Material: SUJ2, hardness Hv: 750, surface roughness: 0.03 μmRa <Test of Bearing Life Length>

Figure 10:
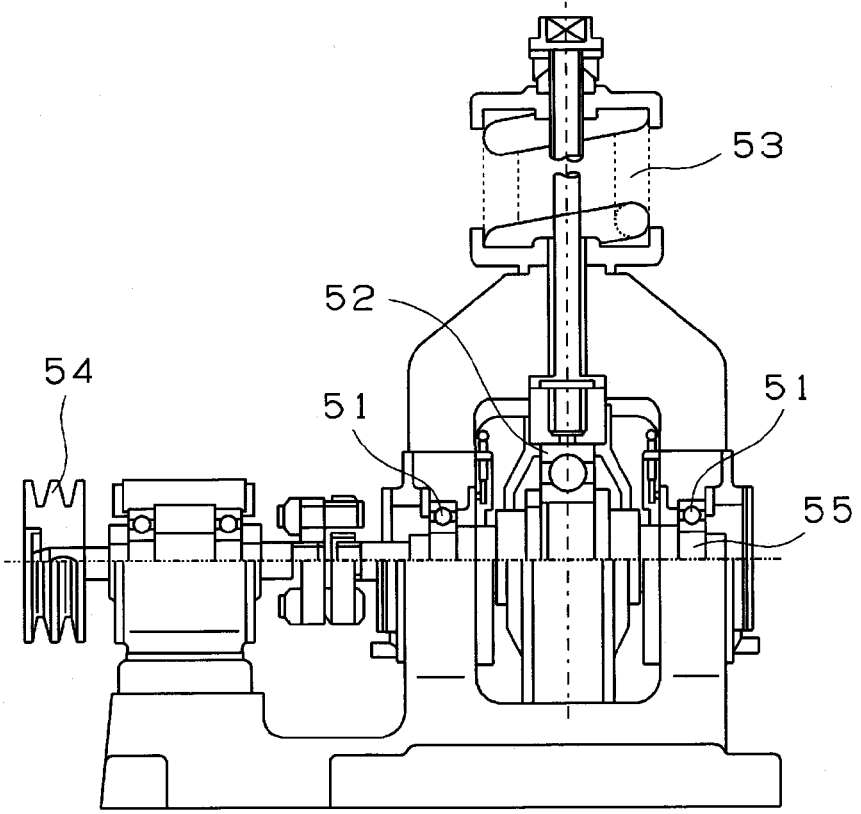
FIG. 10 shows a testing machine used in a bearing life test.

By using the inner and outer rings on which the hard film was formed in the above-described film-forming test, the 6206 rolling bearings (deep groove ball bearings) for the test were assembled. A life length test was conducted on the test bearing by using a testing machine shown in FIG. 10. As shown in FIG. 10, the testing machine is so constructed that a shaft 55 to be rotated by a driving pulley 54 is supported by a pair of test bearings 51 with a load being applied to the shaft 55 from a load-applying coil spring 53 via a load-applying ball bearing 52. The lubrication state is supposed to be favorable. Test conditions are shown below.

Inner and outer rings: Inner and outer rings on which the hard film was formed in the above-described film-forming test.

Rolling element: size: 3/8", number of pieces: nine, material: SUJ2, hardness Hv: 750, surface roughness: 0.005 μmRa
Lubricating oil: VG56
Lambda: not less than three
Maximum contact surface pressure: 3.3 GPa
Number of rotations: 3000 r/minute (rotation of inner ring)
Computed life length: $L_{10}$ life 127 hours
Cutoff time: 200 hours A test of a 20-hour test period of time and a test of a 200-hour test period of time were conducted. By optical microscopic observation, each of the raceway surfaces was checked as to whether the hard films peeled from the innerand outer rings. For example, when a hard film peeled therefrom in the checking at the elapse of the 20-hour test period of time, the life length thereof is 20 hours. When a hard film peeled therefrom in the checking at the elapse of the 200-hour test period of time, the life length thereof is 200 hours. Thus 20 hours, 200 hours, and not less than 200 hours are the levels of the life length thereof. The life lengths of the hard films are shown in tables 1 and 2. As the determination criterion of the life length of each hard film, hard films having a life length not less than 200 hours are recorded as "○". Hard films having a life length less than 200 hours are recorded as "x". Tables show the results.

TABLE 1

|  | Example | | | | | |
|---|---|---|---|---|---|---|
|  | A1 | A2 | A3 | A4 | A5 | A6 |
| Base material[1] | SUJ2 | SUJ2 | SUJ2 | SUJ2 | SUJ2 | SUJ2 |
| Hardness of base material, Hv | 780 | 780 | 780 | 780 | 780 | 780 |
| Surface roughness of base material, μmRa | 0.005 | 0.005 | 0.005 | 0.005 | 0.005 | 0.005 |
| Whether nitriding treatment was made ("○": performed, "—": not performed) | — | — | — | — | — | — |
| Hardness of nitrided layer, Hv | — | — | — | — | — | — |
| Material of first mixed layer[2] | Cr/WC | Cr/WC | Cr/WC | Cr/WC | Cr/WC | Cr/WC |
| Material of second mixed layer[3] | WC/DLC | WC/DLC | WC/DLC | WC/DLC | WC/DLC | WC/DLC |
| Hydrogen content in second mixed layer, atomic % | 26.3 | 18.9 | 44.8 | 25.6 | 25.5 | 26.1 |
| Introduction ratio[4] of methane gas in film-forming condition of second mixed layer | 20 | 10 | 40 | 20 | 20 | 20 |
| Whether relaxing layer[5] was formed ("○": formed, "—": not formed) | ○ | ○ | ○ | ○ | ○ | ○ |
| Film-forming condition of surface layer | | | | | | |
| Introduction ratio[4] of methane gas | 3 | 3 | 3 | 1 | 5 | 1.5 |
| Vacuum degree, Pa | 0.25 | 0.25 | 0.25 | 0.25 | 0.25 | 0.45 |
| Bias voltage (negative), V | 100 | 100 | 100 | 100 | 100 | 150 |
| Specific wear amount, ×10$^{-10}$ mm$^3$/(N·m) | 100 | 100 | 100 | 80 | 145 | 135 |
| Indentation hardness | | | | | | |
| Average value, Gpa | 29.7 | 29.1 | 29.1 | 36.4 | 26.4 | 27.7 |
| Standard deviation, Gpa | 5.0 | 5.0 | 5.0 | 6.3 | 4.9 | 3.4 |
| Average value + standard deviation, Gpa | 34.7 | 34.1 | 34.1 | 42.7 | 31.3 | 31.1 |
| Critical peeling load, N | 74 | 71 | 71 | 74 | 75 | 75 |
| Film thickness, μm | 1.4 | 2.1 | 2.1 | 1.2 | 1.4 | 1.2 |
| Ratio[6] of thickness of surface layer | 0.50 | 0.55 | 0.60 | 0.50 | 0.55 | 0.50 |
| Thrust test in low lambda condition | | | | | | |
| Peeling life length of hard film, hour | 1760 | 1800 | 1880 | 1760 | 1580 | 1580 |
| Determination of life length | ○ | ○ | ○ | ○ | ○ | ○ |
| Thrust test in high lambda condition | | | | | | |
| Peeling life length of hard film, hour | not less than 300 | not less than 300 | not less than 300 | not less than 300 | not less than 300 | not less than 300 |
| Determination of life length | ○ | ○ | ○ | ○ | ○ | ○ |
| 6206 bearing test | | | | | | |
| State of film formed on inner and outer rings | ○ | ○ | ○ | ○ | ○ | ○ |
| Peeling life length of hard film, hour | not less than 200 | not less than 200 | not less than 200 | not less than 200 | not less than 200 | not less than 200 |
| Determination of life length | ○ | ○ | ○ | ○ | ○ | ○ |

|  | Example | | | | | |
|---|---|---|---|---|---|---|
|  | A7 | A8 | A9 | A10 | A11 | A12 |
| Base material[1] | SUJ2 | SUS | S53C | SUJ2 | SUS | SUJ2 |
| Hardness of base material, Hv | 780 | 650 | 650 | 780 | 650 | 780 |
| Surface roughness of base material, μmRa | 0.005 | 0.005 | 0.005 | 0.045 | 0.005 | 0.005 |
| Whether nitriding treatment was made ("○": performed, "—": not performed) | — | — | — | — | ○ | — |
| Hardness of nitrided layer, Hv | — | — | — | — | 1000 | — |
| Material of first mixed layer[2] | Cr/WC | Cr/WC | Cr/WC | Cr/WC | Cr/WC | Cr/WC |
| Material of second mixed layer[3] | WC/DLC | WC/DLC | WC/DLC | WC/DLC | WC/DLC | WC/DLC |
| Hydrogen content in second mixed layer, atomic % | 26.6 | 27.1 | 25.8 | 26.0 | 26.1 | 25.8 |
| Introductions ratio[4] of methane gas in film-forming condition of second mixed layer | 20 | 20 | 20 | 20 | 20 | 20 |
| Whether relaxing layer[5] was formed ("○": formed, "—": not formed) | ○ | ○ | ○ | ○ | ○ | ○ |

TABLE 1-continued

| Film-forming condition of surface layer | | | | | | |
|---|---|---|---|---|---|---|
| Introduction ratio[4] of methane gas | 1 | 3 | 3 | 3 | 3 | 3 |
| Vacuum degree, Pa | 0.80 | 0.25 | 0.25 | 0.25 | 0.25 | 0.25 |
| Bias voltage (negative), V | 100 | 100 | 100 | 100 | 100 | 100 |
| Specific wear amount, $\times 10^{-10}$ mm$^3$/(N·m) | 120 | 100 | 100 | 100 | 100 | 135 |
| Indentation hardness | | | | | | |
| Average value, Gpa | 26.1 | 29.5 | 29.5 | 28.5 | 29.8 | 26.4 |
| Standard deviation, Gpa | 3.0 | 5.2 | 5.3 | 4.5 | 5.1 | 2.0 |
| Average value + standard deviation, Gpa | 29.1 | 34.7 | 34.8 | 33.0 | 34.9 | 28.4 |
| Critical peeling load, N | 73 | 68 | 68 | 66 | 76 | 71 |
| Film thickness, μm | 1.2 | 1.4 | 1.4 | 1.4 | 1.4 | 2.8 |
| Ratio[6] of thickness of surface layer | 0.65 | 0.50 | 0.50 | 0.50 | 0.60 | 0.50 |
| Thrust test in low lambda condition | | | | | | |
| Peeling life length of hard film, hour | 1900 | 1760 | 1760 | 1584 | 1920 | 2460 |
| Determination of life length | ○ | ○ | ○ | ○ | ○ | ○ |
| Thrust test in high lambda condition | | | | | | |
| Peeling life length of hard film, hour | not lass than 300 | not less than 300 | not less than 300 | not less than 300 | not less than 300 | not less than 300 |
| Determination of life length | ○ | ○ | ○ | ○ | ○ | ○ |
| 6206 bearing test | | | | | | |
| State of film formed on inner and outer rings | ○ | ○ | ○ | ○ | ○ | ○ |
| Peeling life length of hard film, hour | not less than 200 | not less than 200 | not less than 200 | not lass than 200 | not less than 200 | not loss than 200 |
| Determination of life length | ○ | ○ | ○ | ○ | ○ | ○ |

[1] SUJ2:SUJ2, SUS:SUS440C, S53C:S53C, SCM:SCM420, CAC:CAC301, SPCC:SPCC
[2] shows layer equivalent to first mixed layer of present invention consisting of Cr and WC. When two components are mixed with each other, material is shown as "first component/second component. Specimen not having first mixed layer is shown as "—".
[3] shows layer equivalent to first mixed layer of present invention consisting of WC and DLC. When two components are mixed with each other, material is shown as "first component/second component. Specimen not having first mixed layer is shown as "—".
[4] Introduction ratio shows ratio of introduction amount (part by volume) of methane gas to introduction amount of 100 (part by volume) of Ar gas.
[5] layer intended to continuously or stepwise change a film-forming condition parameter of surfface layer of present inevention and that of mixed layer thereof.
[6] Ratio of thickness of surface layer to entire film thickness.
[7] Unmeasurable because of peeling during test.

TABLE 2

| | Comparative example | | | | | | |
|---|---|---|---|---|---|---|---|
| | A1 | A2 | A3 | A4 | A5 | A6 | A7 |
| Base material[1] | SUJ2 | SUJ2 | SUJ2 | SUJ2 | SUJ2 | SUJ2 | SUJ2 |
| Hardness of base material, Hv | 780 | 780 | 780 | 780 | 780 | 780 | 780 |
| Surface roughness of base material, μmRa | 0.005 | 0.005 | 0.005 | 0.005 | 0.005 | 0.005 | 0.005 |
| Whether nitriding treatment was made ("○": performed, "—": not performed) | — | — | — | — | — | — | — |
| Hardness of nitrided layer, Hv | — | — | — | — | — | — | — |
| Material of first mixed layer[2] | — | Cr | W | Ti | Cr/WC | Cr/WC | Cr/WC |
| Material of second mixed layer[3] | WC/DLC | WC/DLC | WC/DLC | WC/DLC | — | WC/DLC | WC/DLC |
| Hydrogen content in second mixed layer, atomic % | 26.1 | 26.0 | 25.3 | 26.1 | — | 8.6 | 51.2 |
| Introduction ratio[4] of methane gas in film-forming condition of second mixed layer | 20 | 20 | 20 | 20 | — | 0.5 | 45 |
| Whether relaxing layer[5] was formed ("○", formed, "—": not formed) | ○ | ○ | ○ | ○ | ○ | ○ | ○ |
| Film-forming condition of surface layer | | | | | | | |
| Introduction ratio[4] of methane gas | 3 | 3 | 3 | 3 | 1 | 3 | 3 |
| Vacuum degree, Pa | 0.25 | 0.25 | 0.25 | 0.25 | 0.80 | 0.25 | 0.25 |
| Bias voltage (negative), V | 100 | 100 | 100 | 100 | 100 | 100 | 100 |
| Specific wear amount, $\times 10^{-10}$ mm$^3$/(N·m) | 100 | 100 | 100 | 100 | 7) | 100 | 100 |
| Indentation hardness | | | | | | | |
| Average value, Gpa | 29.1 | 29.1 | 29.1 | 29.1 | 26.1 | 29.1 | 29.1 |
| Standard deviation, Gpa | 5.0 | 5.0 | 5.0 | 5.0 | 3.1 | 5.0 | 5.0 |
| Average value + standard deviation, Gpa | 34.1 | 34.1 | 34.1 | 34.1 | 29.2 | 34.1 | 34.1 |
| Critical peeling load, N | 71 | 71 | 71 | 71 | 25 | 71 | 71 |
| Film thickness, μm | 2.1 | 2.1 | 2.1 | 2.1 | 1.8 | 2.1 | 2.1 |
| Ratio[6] of thickness of surface layer | 0.50 | 0.50 | 0.50 | 0.50 | 0.60 | 0.50 | 0.50 |

TABLE 2-continued

|  | Comparative example | | | | | | |
|---|---|---|---|---|---|---|---|
|  | A1 | A2 | A3 | A4 | A5 | A6 | A7 |
| Thrust test in low lambda condition | | | | | | | |
| Peeling life length of hard film, hour | 1760 | 1760 | 520 | 700 | 220 | 1760 | 1760 |
| Determination of life length | ○ | ○ | X | X | X | ○ | ○ |
| Thrust test in high lambda condition | | | | | | | |
| Peeling life length of hard film, hour | 40 | 60 | 20 | 20 | 20 | 20 | 60 |
| Determination of life length | X | X | X | X | X | X | X |
| 6206 bearing test | | | | | | | |
| State of film formed on inner and outer rings | X | ○ | X | X | X | ○ | ○ |
| Peeling life length of hard film, hour | — | not less than 200 | — | — | — | — | — |
| Determination of life length | — | ○ | — | — | — | — | — |

TABLE 3

|  | Reference example | | | | | | | | |
|---|---|---|---|---|---|---|---|---|---|
|  | A1 | A2 | A3 | A4 | A5 | A6 | A7 | A8 | A9 |
| Base material[1] | SUJ2 | SUJ2 | SUJ2 | SUJ2 | SUJ2 | SUJ2 | SUJ2 | SUJ2 | SUJ2 |
| Hardness of base material, Hv | 210 | 780 | 780 | 780 | 780 | 780 | 780 | 780 | 780 |
| Surface roughness of base material, μmRa | 0.005 | 0.091 | 0.005 | 0.005 | 0.005 | 0.005 | 0.005 | 0.005 | 0.005 |
| Whether nitriding treatment was made ("○": performed, "—": not performed) | — | — | — | — | — | — | — | — | — |
| Hardness of nitrided layer, Hv | — | — | — | — | — | — | — | — | — |
| Material of first mixed layer[2] | Cr/WC | Cr/WC | Cr/WC | Cr/WC | Cr/WC | Cr/WC | Cr/WC | Cr/WC | Cr/WC |
| Material of second mixed layer[3] | WC/DLC | WC/DLC | WC/DLC | WC/DLC | WC/DLC | WC/DLC | WC/DLC | WC/DLC | WC/DLC |
| Hydrogen content in second mixed layer, atomic % | 25.5 | 25.3 | 25.6 | 26.1 | 26.1 | 25.3 | 25.5 | 26.4 | 25.2 |
| Introduction ratio[4] of methane gas in film-forming condition of second mixed layer | 20 | 20 | 20 | 20 | 20 | 20 | 20 | 20 | 20 |
| Whether relaxing layer[5] was formed ("○": formed, "—": not formed) | ○ | ○ | ○ | ○ | ○ | ○ | ○ | ○ | ○ |
| Film-forming condition of surface layer | | | | | | | | | |
| Introduction ratio[4] of methane gas | 3 | 3 | 0 | 10 | 3 | 3 | 3 | 3 | 3 |
| Vacuum degree, Pa | 0.25 | 0.25 | 0.80 | 0.50 | 0.14 | 1.05 | 0.25 | 0.25 | 0.25 |
| Bias voltage (negative), V | 100 | 100 | 100 | 100 | 100 | 100 | 50 | 200 | 100 |
| Specific wear amount, ×10⁻¹⁰ mm³/(N·m) | 100 | 100 | 250 | 300 | Not discharged | 220 | 250 | 80 | 100 |
| Indentation hardness | | | | | | | | | |
| Average value, Gpa | 27.0 | 26.8 | 19.0 | 22.0 | Not discharged | 16.0 | 20.0 | 35.0 | 31.0 |
| Standard deviation, Gpa | 3.5 | 7.9 | 2.0 | 1.5 | Not discharged | 1.0 | 3.0 | 2.0 | 2.0 |
| Average value + standard deviation, Gpa | 30.5 | 34.7 | 21.0 | 23.5 | Not discharged | 17.0 | 23.0 | 37.0 | 33.0 |
| Critical peeling load, N | 30 | 66 | 66 | 75 | Not discharged | 72 | 71 | 61 | 31 |
| Film thickness, μm | 1.4 | 2.1 | 2.8 | 2.4 | Not discharged | 1.5 | 2.4 | 1.2 | 1.1 |
| Ratio[6] of thickness of surface layer | 0.50 | 0.50 | 0.50 | 0.50 | Not discharged | 0.50 | 0.50 | 0.50 | 0.80 |

As shown in table 1, the hard film of each example is excellent in its wear resistance and adhesiveness to the base material and thus could be prevented from peeling off the base material when the bearing was operated. On the other hand, the hard films of the comparative examples A1 through A5 having film structures different from those of examples were inferior to the hard films of the examples in the peeling resistance and the like thereof. The hard films of the compara- Measuring Conditions Grease: calcium• lithium soap/mineral oil-based grease Radial load: 10 kgf Maximum contact surface pressure: 2.5 GPa Frequency of vibrations: 30 Hz Amplitude in reciprocation: 0.47 mm Test period of time: four hours

TABLE 4

| | Example | | | | | | Comparative example | | |
|---|---|---|---|---|---|---|---|---|---|
| | A13 | A14 | A15 | A16 | A17 | A18 | A8 | A9 | A10 |
| Base material[1] | SUJ2 | SUJ2 | SUJ2 | SUJ2 | SUJ2 | SUS | SUJ2 | SUJ2 | SUJ2 |
| Hardness of base material, Hv | 780 | 780 | 780 | 780 | 780 | 650 | 780 | 780 | 780 |
| Surface roughness of base material, μmRa | 0.005 | 0.005 | 0.005 | 0.005 | 0.005 | 0.005 | 0.005 | 0.005 | 0.005 |
| Film-forming method | UBMS | UBMS | UBMS | UBMS | UBMS | UBMS | UBMS | UBMS | UBMS |
| Material of first mixed layer[2] | Cr/WC | Cr/WC | Cr/WC | Cr/WC | Cr/WC | Cr/WC | Cr/WC | Cr/WC | Cr/WC |
| Material of second mixed layer[3] | WC/DLC | WC/DLC | WC/DLC | WC/DLC | WC/DLC | WC/DLC | WC/DLC | W/DLC | W/DLC |
| Hydrogen content in second mixed layer, atomic % | 26.3 | 26.0 | 44.8 | 18.9 | 26.1 | 26.1 | 8.6 | 26.1 | 25.3 |
| Film-forming condition of second mixed layer | | | | | | | | | |
| Introduction ratio[4] of methane gas | 20 | 20 | 40 | 10 | 20 | 20 | 0.5 | 20 | 20 |
| Bias voltage (negative), V | 150 | 100 | 150 | 150 | 150 | 150 | 150 | 100 | 150 |
| Whether relaxing layer[5] was formed ("○": formed, "—": not formed) | ○ | ○ | ○ | ○ | ○ | ○ | ○ | ○ | ○ |
| Film-forming condition of surface layer | | | | | | | | | |
| Introduction ratio[4] of methane gas | 3 | 3 | 3 | 3 | 10 | 3 | 3 | 3 | 3 |
| Vacuum degree, Pa | 0.25 | 0.25 | 0.25 | 0.25 | 0.25 | 0.25 | 0.25 | 0.25 | 0.25 |
| Bias voltage (negative), V | 100 | 100 | 100 | 100 | 100 | 100 | 100 | 100 | 100 |
| Film thickness, μm | 1.4 | 1.4 | 1.4 | 1.4 | 1.4 | 1.4 | 1.4 | 2 | 2 |
| Ratio[4] of thickness of surface layer | 0.50 | 0.50 | 0.50 | 0.50 | 0.50 | 0.50 | 0.50 | 0.50 | 0.50 |
| Fretting corrosion test | | | | | | | | | |
| Depth of wear, μm | 0.5 | 0.8 | 1.0 | 0.8 | 1.0 | 1.0 | 1.7 | 2.3 | 2.5 |
| Specific wear amount, ×10$^{-10}$ mm$^3$/(N · m) | 2.0 | 4.0 | 5.0 | 4.0 | 5.0 | 5.0 | 15.0 | 25.0 | 23.0 |
| Wear amount of steel ball, ×10$^{-5}$ mm$^3$ | 4.3 | 4.0 | 6.0 | 4.0 | 6.0 | 6.0 | 16.0 | 34.0 | 25.0 | tive examples A6 and A7 whose hydrogen contents in the second mixed layer were not in the range of the present invention were inferior to the hard films of the examples in the peeling resistance in the high lambda condition, although the hard films of the comparative examples A6 and A7 had film structures equivalent to those (three-layer structure) of the hard films of the examples.

Examples A13 through A18, Comparative Examples A8 through A10

The hard film of the present invention was subjected to a fretting corrosion test described below to evaluate the resistance thereof to fretting wear. Specimens (φ48 mm×φ8 mm×7 mm, films were formed on plane surfaces) were formed in the conditions shown in table 4. Each layer of the hard film was formed in conditions similar to those of the example A1 except the conditions shown in table 4.

<Fretting Wear Test>

Figure 11:
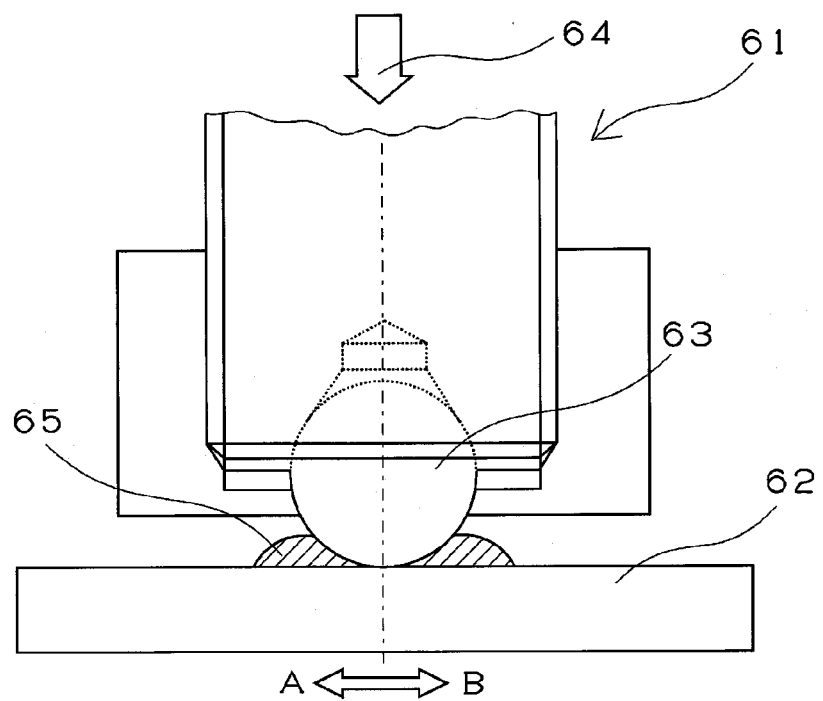
FIG. 11 shows a fretting corrosion testing machine.

FIG. 11 shows a fretting wear testing machine. As shown in FIG. 11, by using a fretting wear testing machine 61, a specimen 62 coated with a grease 65 was reciprocated in a horizontal direction A-B in the following condition with a rigid sphere 63 to which a radial load 64 was applied being placed on the specimen 62 to measure the depth of wear of the specimen 62 and its specific wear amount and the wear amount of the rigid sphere 63.

Table 4 indicates that the hard film of each example is excellent in the fretting resistance thereof. The hard film of each example was capable of restraining the rigid sphere which was the mating material from wearing. On the other hand, the specimen of the comparative example A8 in which the hydrogen content of the second mixed layer was out of the range of the present invention and the specimens of the comparative example A9 and A10 whose film structures were different from that of the present invention were inferior in the fretting resistance thereof and caused the rigid sphere which was the mating material to have a large amount of wear.

[Formation of Film on Plane Plate and Cage]

As the hard film to be formed on the cage of the rolling bearing of present invention, hard films were formed on predetermined base materials respectively to evaluate the properties thereof. In addition, similar hard films were formed on sliding contact surfaces of cages of rolling bearings to evaluate the properties of the bearings.

The base materials used to evaluate the hard films are as shown in the tables. The dimensions of the base materials, the UBMS apparatus, the sputtering gas, and the film-forming condition of the foundation layer and that of the intermediate layer are the same as those of the above-described [formation of film on inner and outer rings].

Examples B1 Through B11, B13, Comparative Examples B1-B9, Reference Examples B1-B8

After the base materials shown in tables 5 through 7 were ultrasonically cleaned with acetone, the base materials were dried. After the base materials were dried, they were mounted on the UBMS/AIP composite apparatus to form the first mixed layer and the second mixed layer both made of the materials shown in the tables in the above-described film-forming condition. The DLC film which was the surface layer was formed on each of the second mixed layers in the film-forming conditions shown in the tables to obtain specimens each having a hard film. "Vacuum degree" shown in the tables means a vacuum degree inside the film-forming chamber of the above-described apparatus. The obtained specimens were subjected to the wear test, the hardness test, the film thickness test, and the scratch test similar to those conducted in the above-described [formation of film on inner and outer rings]. Results are shown in the tables.

Example B12

After a base material (Vickers hardness Hv of 1000) subjected to the plasma nitriding treatment by using the radical nitriding apparatus produced by Japan Electronics Industry Co., Ltd was ultrasonically cleaned with acetone, the base material was dried. After the base material was dried, it was mounted on the UBMS/AIP composite apparatus to form the slslsl (Cr/WC) and the second mixed layer (WC/DLC) both made of the materials shown in table 5 in the above-described film-forming condition. The DLC film which was the surface layer was formed on the tptptp in the film-forming conditions shown in table 5 to obtain a specimen having a hard film. The obtained specimen was subjected to tests similar to the tests conducted on the specimen of the example B1. Results are shown in table 5.

<Test of Formation of Film on Cage for Bearing>

Hard films were formed on the sliding contact surfaces (pocket surfaces) of cages of 6204 rolling bearings (deep groove ball bearing) shown below in conditions used in the examples and the comparative examples. Whether the hard films peeled off the cage immediately after the hard films were formed on the sliding contact surfaces of the cages was checked. Specimens in which the hard films did not peel off the cages when they were taken out of the film-forming chamber were recorded as "○", whereas specimens in which the hard films peeled off the cages when they were taken out of the film-forming chamber were recorded as "x". Tables show the results.

Cage: cages each consisting of two separate iron plates (hard film was formed on sliding contact surface of each cage on which rolling elements slide. A base material (material, hardness, surface roughness) of each cage is as shown in the tables).

<Test of Life Length of Bearing>

Figure 12:
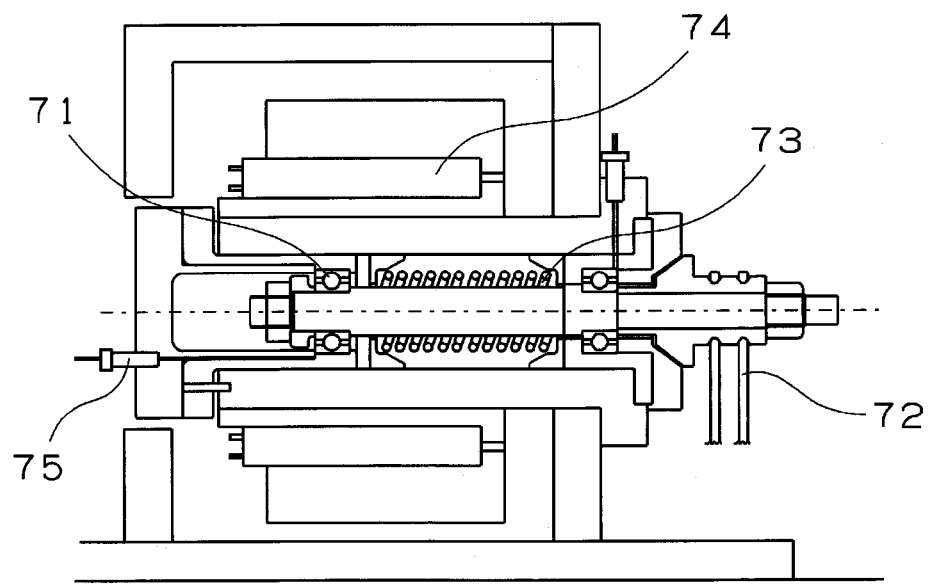
FIG. 12 shows a testing machine used in the bearing life test.

By using the cages on which the hard films were formed in the above-described film-forming test, the 6204 rolling bearings (deep groove ball bearing) for the test were assembled. A life length test was conducted on the test bearings by using a testing machine shown in FIG. 12. As shown in FIG. 12, the testing machine is so constructed that a shaft to be rotated by a pulley 72 is supported by a test bearing 71 with a load being applied to the shaft from a load-applying coil spring 73. The reference numeral 74 denotes a cartridge heater, and the reference numeral 75 denotes a thermocouple. The test conditions are shown below.

Cage: cages each consisting of two separate iron plates (hard film was formed on sliding contact surface of each cage on which rolling elements slide. A base material (material, hardness, surface roughness) of each cage is as shown in the tables).

Test bearing: 6204 (rubber seal)

Lubrication: lithium ester-based grease (viscosity of base oil at 40° C.: 26 mm$^2$/second, worked penetration: 260)

Packed amount: 150 (volume ratio to entire space)

Load: radial load: 67 N, axial load: 67 N

Number of rotations: 10000 r/minute (rotation of inner ring)

Temperature: 150° C.

When seizing has occurred on the cage, the cage has reached the end of its life. When the cage has reached the end of its life, the torque rises rapidly. In this test, a period of time (hour) until before the testing machine stops owing to an overload is set as its life length. Tables show the results. As the determination criterion of the life length of each cage, cages having a life length not less than 350 hours are recorded as "○". Cages having a life length less than 200 hours and less than 350 hours are recorded as "Δ". Cages having a life length less than 200 hours are recorded as "x". Tables show the results.

TABLE 5

| | Example | | | | | | |
|---|---|---|---|---|---|---|---|
| | B1 | B2 | B3 | B4 | B5 | B6 | B7 |
| Base material[1] | SPCC | SPCC | SPCC | SPCC | SPCC | SPCC | SPCC |
| Hardness of base material, Hv | 190 | 190 | 190 | 190 | 190 | 190 | 190 |
| Surface roughness of base material, μmRa | 0.24 | 0.24 | 0.24 | 0.24 | 0.24 | 0.24 | 0.24 |
| Whether nitriding treatment was made ("○": performed, "—": not performed) | — | — | — | — | — | — | — |
| Hardness of nitrided layer, Hv | — | — | — | — | — | — | — |
| Material of first mixed layer[2] | Cr/WC | Cr/WC | Cr/WC | Cr/WC | Cr/WC | Cr/WC | Cr/WC |
| Material of second mixed layer[3] | WC/DLC | WC/DLC | WC/DLC | WC/DLC | WC/DLC | WC/DLC | WC/DLC |
| Hydrogen content in second mixed layer, atomic % | 26.3 | 18.9 | 44.8 | 25.6 | 25.5 | 26.1 | 26.6 |
| Introduction ratio[4] of methane gas in film-forming condition of second mixed layer | 20 | 10 | 40 | 20 | 20 | 20 | 20 |
| Whether relaxing layer[5] was formed ("○": formed, "—": not formed) | ○ | ○ | ○ | ○ | ○ | ○ | ○ |
| Film-forming condition of surface layer | | | | | | | |
| Introduction ratio[4] of methane gas | 3 | 3 | 3 | 1 | 5 | 1.5 | 1 |
| Vacuum degree, Pa | 0.25 | 0.25 | 0.25 | 0.25 | 0.25 | 0.45 | 0.80 |
| Bias voltage (negative), V | 100 | 100 | 100 | 100 | 100 | 150 | 100 |
| Specific wear amount, ×10$^{-10}$ mm$^3$/(N · m) | 100 | 100 | 100 | 80 | 145 | 135 | 120 |

TABLE 5-continued

| Indentation hardness | | | | | | | |
|---|---|---|---|---|---|---|---|
| Average value, Gpa | 29.7 | 29.1 | 29.1 | 36.4 | 26.4 | 27.7 | 26.1 |
| Standard deviation, Gpa | 5.0 | 5.0 | 5.0 | 6.3 | 4.9 | 3.4 | 3.0 |
| Average value + standard deviation, Gpa | 34.7 | 34.1 | 34.1 | 42.7 | 31.3 | 31.1 | 29.1 |
| Film thickness, μm | 1.4 | 2.1 | 2.1 | 1.2 | 1.4 | 1.2 | 1.2 |
| Ratio[6] of thickness of surface layer | 0.50 | 0.55 | 0.60 | 0.50 | 0.55 | 0.50 | 0.65 |
| 6204 bearing test | | | | | | | |
| State of film formed on cage | ○ | ○ | ○ | ○ | ○ | ○ | ○ |
| Seizing-resistant life (average value: N = 5), hour | 432 | 425 | 440 | 422 | 360 | 363 | 450 |
| Determination of life length | ○ | ○ | ○ | ○ | ○ | ○ | ○ |

|  | Example | | | | | |
|---|---|---|---|---|---|---|
|  | B8 | B9 | B10 | B11 | B12 | B13 |
| Base material[1] | SUS | SPCC | SCM | SPCC | SPCC | SPCC |
| Hardness of base material, Hv | 200 | 540 | 750 | 190 | 190 | 190 |
| Surface roughness of base material, μmRa | 0.31 | 0.18 | 0.21 | 0.45 | 0.24 | 0.24 |
| Whether nitriding treatment was made ("○": performed, "—": not performed) | — | — | — | — | ○ | — |
| Hardness of nitrided layer, Hv | — | — | — | — | 1000 | — |
| Material of first mixed layer[2] | Cr/WC | Cr/WC | Cr/WC | Cr/WC | Cr/WC | Cr/WC |
| Material of second mixed layer[3] | WC/DLC | WC/DLC | WC/DLC | WC/DLC | WC/DLC | WC/DLC |
| Hydrogen content in second mixed layer, atomic % | 27.1 | 25.8 | 26.0 | 26.1 | 25.8 | 25.2 |
| Introduction ratio[4] of methane gas in film-forming condition of second mixed layer | 20 | 20 | 20 | 20 | 20 | 20 |
| Whether relaxing layer[5] was formed ("○": formed, "—": not formed) | ○ | ○ | ○ | ○ | ○ | ○ |
| Film-forming condition of surface layer | | | | | | |
| Introduction ratio[4] of methane gas | 3 | 3 | 3 | 3 | 3 | 3 |
| Vacuum degree, Pa | 0.25 | 0.25 | 0.25 | 0.25 | 0.25 | 0.25 |
| Bias voltage (negative), V | 100 | 100 | 100 | 100 | 100 | 100 |
| Specific wear amount, ×10$^{-10}$ mm$^3$/(N·m) | 100 | 100 | 100 | 100 | 100 | 135 |
| Indentation hardness | | | | | | |
| Average value, Gpa | 29.5 | 29.5 | 29.5 | 28.5 | 29.8 | 26.4 |
| Standard deviation, Gpa | 5.2 | 5.3 | 5.3 | 4.5 | 5.1 | 2.0 |
| Average value + standard deviation, Gpa | 34.7 | 34.8 | 34.8 | 33.0 | 34.9 | 28.4 |
| Film thickness, μm | 1.4 | 1.4 | 1.4 | 1.4 | 1.4 | 2.8 |
| Ratio[6] of thickness of surface layer | 0.50 | 0.50 | 0.50 | 0.50 | 0.60 | 0.50 |
| 6204 bearing test | | | | | | |
| State of film formed on cage | ○ | ○ | ○ | ○ | ○ | ○ |
| Seizing-resistant life (average value: N = 5), hour | 435 | 459 | 540 | 362 | 558 | 637 |
| Determination of life length | ○ | ○ | ○ | ○ | ○ | ○ |

TABLE 6

|  | Comparateive example | | | | | | | | |
|---|---|---|---|---|---|---|---|---|---|
|  | B1 | B2 | B3 | B4 | B5 | B6 | B7 | B8 | B9 |
| Base material[1] | SPCC | CAC | SPCC | SPCC | SPCC | SPCC | SPCC | SPCC | SPCC |
| Hardness of base material, Hv | 190 | 160 | 190 | 190 | 190 | 190 | 190 | 190 | 190 |
| Surface roughness of base material, μmRa | 0.24 | 0.38 | 0.24 | 0.24 | 0.24 | 0.24 | 0.24 | 0.24 | 0.24 |
| Whether nitriding treatment was made ("○": performed, "—": not performed) | — | — | — | — | — | — | — | — | — |
| Hardness of nitrided layer, Hv | — | — | — | — | — | — | — | — | — |
| Material of first mixed layer[2] | — | Cr/WC | — | Cr/WC | W | Ti | Cr/WC | Cr/WC | Cr/WC |
| Material of second mixed layer[3] | — | WC/DLC | WC/DLC | WC/DLC | WC/DLC | WC/DLC | — | WC/DLC | WC/DLC |
| Hydrogen content in second mixed layer, atomic % | — | 25.3 | 26.0 | 25.3 | 26.1 | 25.2 | — | 8.6 | 51.2 |
| Introduction ratio[4] of methane gas in film-forming condition of second mixed | — | 20 | 20 | 20 | 20 | 20 | — | 0.5 | 45 |
| Whether relaxing layer[5] was formed ("○": formed, "—": not formed) | — | ○ | ○ | ○ | ○ | ○ | ○ | ○ | ○ |

TABLE 6-continued

| | Comparateive example | | | | | | | | |
|---|---|---|---|---|---|---|---|---|---|
| | B1 | B2 | B3 | B4 | B5 | B6 | B7 | B8 | B9 |
| Film-forming condition of surface layer | | | | | | | | | |
| Introduction ratio[4] of methane gas | — | 3 | 3 | 3 | 3 | 3 | 1 | 3 | 3 |
| Vacuum degree, Pa | — | 0.25 | 0.25 | 0.25 | 0.25 | 0.25 | 0.80 | 0.25 | 0.25 |
| Bias voltage (negative), V | — | 100 | 100 | 100 | 100 | 100 | 100 | 100 | 100 |
| Specific wear amount, ×10$^{-10}$ mm$^3$/(Nm) | — | 100 | 100 | 100 | 100 | 100 | 7) | 100 | 100 |
| Indentation hardness | | | | | | | | | |
| Average value, Gpa | — | 29.5 | 29.1 | 29.1 | 29.1 | 29.1 | 26.1 | 29.1 | 29.1 |
| Standard deviation, Gpa | — | 5.2 | 5.0 | 5.0 | 5.0 | 5.0 | 3.1 | 5.0 | 5.0 |
| Average value + standard deviation, Gpa | — | 34.7 | 34.1 | 34.1 | 34.1 | 34.1 | 29.2 | 34.1 | 34.1 |
| Film thickness, μm | — | 1.4 | 2.1 | 2.1 | 2.1 | 2.1 | 1.8 | 2.1 | 2.1 |
| Ratio[6] of thickness of surface layer | — | 0.50 | 0.50 | 0.50 | 0.50 | 0.50 | 0.90 | 0.50 | 0.50 |
| 6204 bearing test | | | | | | | | | |
| State of film formed on cage | — | X | X | ○ | X | X | X | ○ | ○ |
| Seizing-resistant life (average value: N = 5), hour | 150 | — | — | 230 | — | — | — | 300 | 332 |
| Determination of life length | X | — | — | Δ | — | — | — | Δ | Δ |

TABLE 7

| | Reference example | | | | | | | |
|---|---|---|---|---|---|---|---|---|
| | B1 | B2 | B3 | B4 | B5 | B6 | B7 | B8 |
| Base material[1] | SPCC | SPCC | SPCC | SPCC | SPCC | SPCC | SPCC | SPCC |
| Hardness of base material, Hv | 190 | 190 | 190 | 190 | 190 | 190 | 190 | 190 |
| Surface roughness of base material, μmRa | 0.91 | 0.24 | 0.24 | 0.24 | 0.24 | 0.24 | 0.24 | 0.24 |
| Whether nitriding treatment was made ("○": performed, "—": not performed) | — | — | — | — | — | — | — | — |
| Hardness of nitrided layer, Hv | — | — | — | — | — | — | — | — |
| Material of first mixed layer[2] | Cr/WC | Cr/WC | Cr/WC | Cr/WC | Cr/WC | Cr/WC | Cr/WC | Cr/WC |
| Material of second mixed layer[3] | WC/DLC | WC/DLC | WC/DLC | WC/DLC | WC/DLC | WC/DLC | WC/DLC | WC/DLC |
| Hydrogen content in second mixed layer, atomic % | 26.1 | 25.6 | 26.1 | 26.1 | 25.3 | 25.5 | 26.4 | 25.2 |
| Introduction ratio[4] of methane gas in film-forming condition of second mixed layer | 20 | 20 | 20 | 20 | 20 | 20 | 20 | 20 |
| Whether relaxing layer[5] was formed ("○": formed, "—": not formed) | ○ | ○ | ○ | ○ | ○ | ○ | ○ | ○ |
| Film-forming condition of surface layer | | | | | | | | |
| Introduction ratio[4] of methane gas | 3 | 0 | 10 | 3 | 3 | 3 | 3 | 3 |
| Vacuum degree, Pa | 0.25 | 0.80 | 0.50 | 0.14 | 1.05 | 0.25 | 0.25 | 0.25 |
| Bias voltage (negative), V | 100 | 100 | 100 | 100 | 100 | 50 | 200 | 100 |
| Specific wear amount, ×10$^{-10}$ mm$^3$/(N·m) | 100 | 250 | 300 | Not discharged | 220 | 250 | 80 | 100 |
| Indentation hardness | | | | | | | | |
| Average value, Gpa | 26.8 | 19.0 | 22.0 | Not discharged | 16.0 | 20.0 | 35.0 | 31.0 |
| Standard deviation, Gpa | 7.9 | 2.0 | 1.5 | Not discharged | 1.0 | 3.0 | 2.0 | 2.0 |
| Average value + standard deviation, Gpa | 34.7 | 21.0 | 23.5 | Not discharged | 17.0 | 23.0 | 37.0 | 33.0 |
| Film thickness, μm | 2.1 | 2.8 | 2.4 | Not discharged | 1.5 | 2.4 | 1.2 | 1.1 |
| Ratio[6] of thickness of surface layer | 0.50 | 0.50 | 0.50 | Not discharged | 0.50 | 0.50 | 0.50 | 0.80 |

As shown in table 5, the hard film of each example is excellent in its wear resistance and adhesiveness to the surface of the base material. Therefore it is possible to prevent the hard films from peeling off the cages while the bearings were in operation.

INDUSTRIAL APPLICABILITY

In the rolling bearing of the present invention, the hard film containing the DLC film formed on the raceway surfaces of the inner and outer rings, the rolling contact surfaces of the rolling elements, and the sliding contact surface of the cage are excellent in its peeling resistance, and thus the intrinsic properties of the DLC film can be displayed. Thereby the rolling bearing of the present invention is excellent in its resistance to seizing, wear, and corrosion. Therefore the rolling bearing of the present invention is applicable to various uses including a case in which the rolling bearing is used in a severe lubrication state.

EXPLANATION OF REFERENCE NUMERALS AND SYMBOLS

1: rolling bearing (deep groove ball bearing)
2: inner ring
3: outer ring
4: rolling element
5: cage
6: sealing member
7: grease
8: hard film
8a: first mixed layer
8b: second mixed layer
8c: surface layer
8d: relaxing layer
11: bias power source
12: base material
13: film (layer)
15: target
16: magnetic field lines
17: Ar ion
18: ionized target
19: high-density plasma
21: AIP vaporization source material
22: disk
23: base material
24: sputtering vaporization source material (target)
31: specimen
32: mating material
33: arm portion
34: load
35: load cell
41: specimen
42: rolling element
43: aligning ball
44: rotary ball spline
45: bearing washer
46: heater
47: thermocouple
51: specimen bearing
52: load-applying ball bearing
53: load-applying coil spring
54: driving pulley
55: shaft
61: fretting corrosion testing machine
62: specimen
63: rigid sphere
64: radial load
65: grease
71: specimen bearing
72: pulley
73: load-applying coil spring
74: cartridge heater
75: thermocouple

The invention claimed is:

1. A hard film formed on a surface of a base material, said hard film having a structure composed of a first mixed layer, consisting mainly of chromium and tungsten carbide, which is formed directly on a surface of said base material, a second mixed layer, consisting mainly of tungsten carbide and diamond-like carbon, which is formed on said first mixed layer, and a surface layer, consisting mainly of diamond-like carbon, which is formed on said second mixed layer, wherein in said first mixed layer, a content rate of said chromium becomes continuously or stepwise lower and that of said diamond-like carbon becomes continuously or stepwise higher from a side of said base material toward a side of said second mixed layer; in said second mixed layer, a content rate of said tungsten carbide becomes continuously or stepwise lower and that of said diamond-like carbon becomes continuously or stepwise higher from a side of said first mixed layer toward a side of said surface layer; and a content of hydrogen in said second mixed layer is set to 10 to 45 atomic percent.

2. The hard film according to claim 1, wherein a specific wear amount of said hard film is less than $200 \times 10^{-10}$ mm$^3$/(N·m) when a mating material consisting of a SUJ2 quenched steel having a surface roughness Ra of not more than 0.01 μm and Vickers hardness of HV 780 is rotated at a rotational speed of 0.05 m/s for 30 minutes with said hard film in contact with said mating material by applying a load of 0.5 GPa in a Hertzian maximum contact surface pressure to said hard film.

3. The hard film according to claim 2, wherein a sum of an average value of indentation hardnesses and a standard deviation value is 25 to 45 GPa.

4. The hard film according to claim 2, wherein a critical peeling load in a scratch test is not less than 50 N.

5. The hard film according to claim 1, wherein said surface layer consists of a film formed by using an unbalanced magnetron sputtering apparatus using argon gas as a sputtering gas, said surface layer being formed by using a graphite target and a hydrocarbon-based gas in combination as a carbon supply source and depositing carbon atoms generated by said carbon supply source on said second mixed layer in conditions in which a ratio of an amount of said hydrocarbon-based gas to be introduced into said apparatus is set to 1 to 5 to 100 which is an amount of said argon gas to be introduced thereinto, a vacuum degree inside said apparatus is set to 0.2 to 0.8 Pa, and a bias voltage to be applied to said base material is set to 70 to 150V.

6. The hard film according to claim 5, wherein said surface layer has a relaxing layer at a side adjacent to said second mixed layer; and said relaxing layer is formed by continuously or stepwise changing at least one of a rate of an introduction amount of said hydrocarbon-based gas, a vacuum degree inside said apparatus, and a bias voltage to be applied to said base material.

7. The hard film according to claim 5, wherein said hydrocarbon-based gas is methane gas.

8. The hard film according to claim 1, which has a thickness of 0.5 to 3 μm, wherein a ratio of a thickness of said surface layer to that of said hard film is not more than 0.7.

9. A hard film formed body comprising a base material and a hard film formed on a surface of said base material, wherein said hard film is as defined in claim 1.

10. The hard film formed body according to claim 9, wherein said base material consists of a cemented carbide material or an iron-based material.

11. A rolling bearing comprising an inner ring having an inner ring raceway surface on an outer circumference thereof, an outer ring having an outer ring raceway surface on an inner circumference thereof, a plurality of rolling elements which roll between said inner ring raceway surface and said outer ring raceway surface, and a cage retaining said rolling elements, wherein at least one bearing member selected from among said inner ring, said outer ring, said rolling elements, and said cage is made of an iron-based material; a hard film is formed on surfaces of said bearing members made of said iron-based material and on at least one surface selected from among said inner ring raceway surface, said outer ring raceway surface, said rolling contact surfaces of said rolling elements, and said sliding contact surface of said cage; and said hard film has a structure composed of a first mixed layer, consisting mainly of chromium and tungsten carbide, which is formed directly on said surfaces of said bearing members, a second mixed layer, consisting mainly of tungsten carbide and diamond-like carbon, which is formed on said first mixed layer, and a surface layer, consisting mainly of diamond-like carbon, which is formed on said second mixed layer; and in said first mixed layer, a content rate of said chromium becomes continuously or stepwise lower and that of said tungsten carbide becomes continuously or stepwise higher from said surfaces of said bearing members toward a side of said second mixed layer; in said second mixed layer, a content rate of said tungsten carbide becomes continuously or stepwise lower and that of said diamond-like carbon becomes continuously or stepwise higher from a side of said first mixed layer toward a side of said surface layer; and a content of hydrogen in said second mixed layer is set to 10 to 45 atomic percent.

12. The rolling bearing according to claim 11, wherein said rolling elements are balls; and said inner ring raceway surface and said outer ring raceway surface are circular curved surfaces which guide said rolling elements.

13. The rolling bearing according to claim 11, wherein said rolling elements are balls; and said sliding contact surface of said cage is a pocket surface which retains said balls thereon and allows said rolling elements to slide thereon.

14. The rolling bearing according to claim 11, wherein said iron-based material forming said inner ring, said outer ring, and said rolling elements is high carbon chromium bearing steel, carbon steel, tool steel or martensitic stainless steel.

15. The rolling bearing according to claim 14, wherein a hardness of surfaces of said inner ring, said outer ring or said rolling elements on which said hard film is to be formed is set to not less than Hv 650 in Vickers hardness.

16. The rolling bearing according to claim 11, wherein said iron-based material forming said cage is a cold-rolled steel plate, carbon steel, chromium steel, chromium molybdenum steel, nickel chromium molybdenum steel or austenitic stainless steel.

17. The rolling bearing according to claim 16, wherein a hardness of a sliding contact surface on which said hard film is to be formed is not less than Hv 450 in Vickers hardness.

18. The rolling bearing according to claim 11, wherein a nitrided layer is formed on said surfaces on which said hard film is to be formed by subjecting said surfaces to nitriding treatment before said hard film is formed on said surfaces.

19. The rolling bearing according to claim 18, wherein as said nitriding treatment, plasma nitriding treatment is performed; and a hardness of said surfaces subjected to said nitriding treatment is not less than 1000 in Vickers hardness Hv.

20. The rolling bearing according to claim 11, wherein a surface roughness Ra of said surfaces of said inner ring, said outer ring or said rolling elements on which said hard film is to be formed is set to not more than 0.05 μm.

21. The rolling bearing according to claim 11, wherein a surface roughness Ra of said sliding contact surface of said cage on which said hard film is to be formed is set to not more than 0.5 μm.

22. The rolling bearing according to claim 11, wherein grease is packed.

* * * * *